United States Patent
Sato et al.

(10) Patent No.: US 10,311,845 B2
(45) Date of Patent: Jun. 4, 2019

(54) FILTER CHARACTERISTICS CHANGING DEVICE

(71) Applicant: CASIO COMPUTER CO., LTD., Shibuya-ku, Tokyo (JP)

(72) Inventors: Hiroki Sato, Nishi-Tokyo (JP); Masuo Yokota, Fussa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/900,095

(22) Filed: Feb. 20, 2018

(65) Prior Publication Data
US 2018/0268793 A1  Sep. 20, 2018

(30) Foreign Application Priority Data
Mar. 15, 2017 (JP) .................. 2017-050164

(51) Int. Cl.
| | | |
|---|---|---|
| G10H 1/02 | (2006.01) | |
| G10H 1/00 | (2006.01) | |
| G10H 1/12 | (2006.01) | |
| H03H 17/04 | (2006.01) | |
| H03H 17/02 | (2006.01) | |

(Continued)

(52) U.S. Cl.
CPC ............ G10H 1/02 (2013.01); G10H 1/0008 (2013.01); G10H 1/0091 (2013.01); G10H 1/12 (2013.01);
(Continued)

(58) Field of Classification Search
CPC .......... G10H 1/02; G10H 1/0091; G10H 1/12; G10H 1/46; G10H 1/0008; G10H 1/18;
(Continued)

(56) References Cited

U.S. PATENT DOCUMENTS 5,073,942 A * 12/1991 Yoshida ............... G10H 1/0091
 381/61
5,553,150 A * 9/1996 Kozuki ............... G10H 1/0091
 381/61

(Continued)

FOREIGN PATENT DOCUMENTS

JP   01012320 Y2   4/1989
JP   06083334 A    3/1994

(Continued)

OTHER PUBLICATIONS

Japanese Office Action dated May 17, 2018 (and English language translation thereof) issued in counterpart Japanese Application No. 2017-050164.

(Continued)

*Primary Examiner* — Jeffrey Donels
(74) *Attorney, Agent, or Firm* — Holtz, Holtz & Volek PC

(57) ABSTRACT

When an instruction is provided for changing a characteristic of a set filter which includes a plurality of partial filters and forms a specified characteristic by combining a plurality of partial filters, a processor performs, as crossfading processing for a first filter and a second filter among the plurality of partial filters, fade-out processing of gradually decreasing a degree of contribution of the first filter to the characteristic and fade-in processing of gradually increasing a degree of contribution of the second filter to the characteristic. As a result, unnaturalness occurring at the time of changing filter characteristics is solved.

11 Claims, 12 Drawing Sheets

(51) Int. Cl.
*G10H 1/18* (2006.01)
*G10H 1/057* (2006.01)
*G10K 15/08* (2006.01)

(52) U.S. Cl.
CPC ........ *H03H 17/0294* (2013.01); *H03H 17/04* (2013.01); *G10H 1/00* (2013.01); *G10H 1/057* (2013.01); *G10H 1/18* (2013.01); *G10H 2210/265* (2013.01); *G10H 2210/281* (2013.01); *G10H 2210/315* (2013.01); *G10H 2240/071* (2013.01); *G10H 2250/025* (2013.01); *G10H 2250/035* (2013.01); *G10H 2250/055* (2013.01); *G10H 2250/115* (2013.01); *G10H 2250/121* (2013.01); *G10H 2250/541* (2013.01); *G10K 15/08* (2013.01); *H03H 2017/0295* (2013.01); *H03H 2017/0472* (2013.01)

(58) Field of Classification Search
CPC ....... G10H 2250/115; G10H 2250/025; G10H 2250/541; G10H 2250/121; G10H 1/057; G10H 2250/041; G10H 2250/035; G10H 2240/071; G10H 2210/315; G10H 2210/265; G10H 1/00; G10H 2250/055; G10H 2210/281; H04S 7/30; G10K 15/08; G10K 15/12; H03H 17/0294; H03H 17/0009; H03H 17/0264; H03H 17/04; H03H 2017/0295; H03H 2017/0472; H04R 5/04
USPC .......................................................... 84/627
See application file for complete search history.

(56) References Cited

U.S. PATENT DOCUMENTS

| | | | | |
|---|---|---|---|---|
| 5,917,917 A | * | 6/1999 | Jenkins | G10H 1/0091 381/63 |
| 6,023,018 A | | 2/2000 | Iwase | |
| 6,067,072 A | * | 5/2000 | Fujishita | G11B 27/028 348/E5.102 |
| 6,208,687 B1 | * | 3/2001 | Clemow | H03H 17/0294 375/232 |
| 7,062,337 B1 | | 6/2006 | Blesser | |
| 7,860,590 B2 | | 12/2010 | Blesser | |
| 7,860,591 B2 | | 12/2010 | Blesser | |
| 8,389,845 B2 | * | 3/2013 | Kunimoto | G10H 7/04 84/605 |
| 8,908,874 B2 | | 12/2014 | Johnston et al. | |
| 9,042,565 B2 | | 5/2015 | Jot et al. | |
| 9,154,896 B2 | | 10/2015 | Mahabub et al. | |
| 9,728,181 B2 | | 8/2017 | Jot et al. | |
| 2001/0009584 A1 | * | 7/2001 | Suruga | H04H 60/04 381/119 |
| 2005/0157894 A1 | * | 7/2005 | Andrews | H04S 7/30 381/307 |
| 2006/0116781 A1 | * | 6/2006 | Blesser | H04R 5/04 700/94 |
| 2006/0233387 A1 | | 10/2006 | Blesser | |
| 2011/0093104 A1 | | 4/2011 | Blesser | |
| 2012/0057715 A1 | * | 3/2012 | Johnston | G10L 19/008 381/63 |
| 2012/0082319 A1 | | 4/2012 | Jot et al. | |
| 2012/0213375 A1 | * | 8/2012 | Mahabub | H04S 5/00 381/17 |
| 2015/0332663 A1 | | 11/2015 | Jot et al. | |

FOREIGN PATENT DOCUMENTS

| | | |
|---|---|---|
| JP | 2003263179 A | 9/2003 |
| JP | 3620264 B2 | 2/2005 |
| JP | 2005266681 A | 9/2005 |

OTHER PUBLICATIONS

Extended European Search Report (EESR) dated Apr. 5, 2018 issued in counterpart European Application No. 18158250.3.

* cited by examiner

EXTERNAL VIEW

BLOCK DIAGRAM

DATA STRUCTURE OF ROM 11

DATA STRUCTURE OF RAM 13 FOR CPU

FIG. 8A

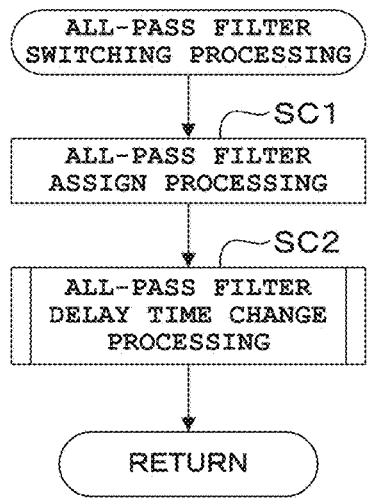

FIG. 8B

OPERATION EXAMPLE OF
ALL-PASS FILTER ASSIGN PROCESSING

|  | APF1 | APF2 | APF3 | APF4 | APF5 |
|---|---|---|---|---|---|
| BEFORE SWITCHING | OLD SETTINGS | OLD SETTINGS | OLD SETTINGS | OLD SETTINGS | BYPASS BP STATE (UNASSIGNED) |
| SWITCHING STAGE 1 | CROSSFAD-ING(F→BP) | OLD SETTINGS | OLD SETTINGS | OLD SETTINGS | CROSSFAD-ING(BP→F) |
| SWITCHING STAGE 2 | CROSSFAD-ING(BP→F) | CROSSFAD-ING(F→BP) | OLD SETTINGS | OLD SETTINGS | NEW SETTINGS |
| SWITCHING STAGE 3 | NEW SETTINGS | CROSSFAD-ING(BP→F) | CROSSFAD-ING(F→BP) | OLD SETTINGS | NEW SETTINGS |
| SWITCHING STAGE 4 | NEW SETTINGS | NEW SETTINGS | CROSSFAD-ING(BP→F) | CROSSFAD-ING(F→BP) | NEW SETTINGS |
| AFTER SWITCHING | NEW SETTINGS | NEW SETTINGS | NEW SETTINGS | BYPASS BP STATE (UNASSIGNED) | NEW SETTINGS |

FIG. 10A

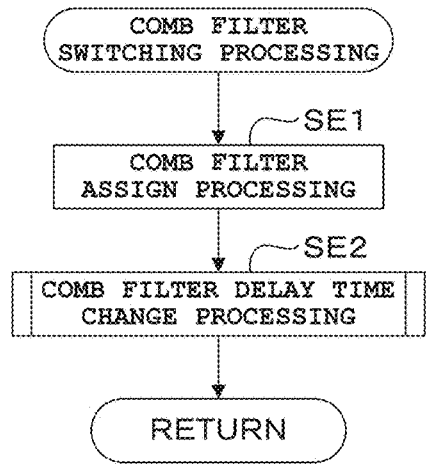

FIG. 10B

OPERATION EXAMPLE OF
COMB FILTER ASSIGN PROCESSING

|  | APF1 | APF2 | APF3 | APF4 | APF5 |
|---|---|---|---|---|---|
| BEFORE SWITCHING | OLD SETTINGS | OLD SETTINGS | OLD SETTINGS | OLD SETTINGS | BYPASS BP STATE (UNASSIGNED) |
| SWITCHING STAGE 1 | FADE-OUT | OLD SETTINGS | OLD SETTINGS | OLD SETTINGS | FADE-IN |
| SWITCHING STAGE 2 | FADE-IN | FADE-OUT | OLD SETTINGS | OLD SETTINGS | NEW SETTINGS |
| SWITCHING STAGE 3 | NEW SETTINGS | FADE-IN | FADE-OUT | OLD SETTINGS | NEW SETTINGS |
| SWITCHING STAGE 4 | NEW SETTINGS | NEW SETTINGS | FADE-IN | FADE-OUT | NEW SETTINGS |
| AFTER SWITCHING | NEW SETTINGS | NEW SETTINGS | NEW SETTINGS | BYPASS BP STATE (UNASSIGNED) | NEW SETTINGS |

FILTER CHARACTERISTICS CHANGING DEVICE

CROSS-REFERENCE TO RELATED APPLICATION

This application is based upon and claims the benefit of priority from the prior Japanese Patent Application No. 2017-050164, filed Mar. 15, 2017, the entire contents of which are incorporated herein by reference.

BACKGROUND OF THE INVENTION

1. Field of the Invention

The present invention relates to a filter characteristics changing device, a filter characteristics changing method, a program, and an electronic instrument for solving unnaturalness occurring at the time of changing filter characteristics.

2. Description of the Related Art

Effect providing devices have been known which provide various effects (sound effects) such as reverb, delay, and echo to musical sound data generated from a sound source of an electronic instrument or the like. For example, Japanese Utility Model Publication No. 01-012320 discloses an effect providing device which separately forms an initial reflection sound acquired by delaying and changing input musical sound data and a reverberation sound generated based on musical sound data divided into a plurality of frequency bands and acquired by synthesizing reverberation signals having different delay change modes for each band, and thereby acquires a reverberation effect close to a natural sound. Also, in recent years, an effect providing device using a DSP (Digital Signal Processor) which performs waveform arithmetic processing at high speeds has been known, and an example of this type of device is disclosed in Japanese Patent No. 3620264.

This effect providing device structured by using a DSP which performs waveform arithmetic processing at high speeds can provide various effects (sound effects) by rewriting a microprogram to be executed and control data. For example, as for reverb known as a reverberation effect, a plurality of reverb types with different reverberation characteristics can be supported. The reverb types herein are types of sound fields of different reverberation characteristics.

SUMMARY OF THE INVENTION

In accordance with one aspect of the present invention, there is provided a filter characteristics changing device comprising: a set filter which includes a plurality of partial filters and forms a specified characteristic by combining the plurality of partial filters; and a processor which performs, as crossfading processing for a first filter and a second filter among the plurality of partial filters, fade-out processing of gradually decreasing a degree of contribution of the first filter to the characteristic and fade-in processing of gradually increasing a degree of contribution of the second filter to the characteristic, when an instruction is provided for changing the characteristic formed by the set filter.

In accordance with another aspect of the present invention, there is provided a filter characteristics changing method, wherein a device performs, when an instruction is provided for changing a characteristic of a set filter which includes a plurality of partial filters and forms a specified characteristic by combining the plurality of partial filters, fade-out processing of gradually decreasing a degree of contribution of a first filter to the characteristic and fade-in processing of gradually increasing a degree of contribution of a second filter to the characteristic, as crossfading processing for the first filter and the second filter among the plurality of partial filters.

In accordance with another aspect of the present invention, there is provided a non-transitory computer-readable storage medium having stored thereon a program that is executable by a computer to perform functions comprising; performing, when an instruction is provided for changing a characteristic of a set filter which includes a plurality of partial filters and forms a specified characteristic by combining the plurality of partial filters, fade-out processing of gradually decreasing a degree of contribution of a first filter to the characteristic and fade-in processing of gradually increasing a degree of contribution of a second filter to the characteristic, as crossfading processing for the first filter and the second filter among the plurality of partial filters.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 8A is a flowchart of the operation of all-pass filter switching processing to be executed by the CPU 10 and FIG. 8B is a diagram showing an example of the operation of all-pass filter assign processing;

FIG. 10A is a flowchart of the operation of comb filter switching processing and FIG. 10B is a diagram showing an example of the operation of comb filter assign processing;

DETAILED DESCRIPTION OF THE PREFERRED EMBODIMENTS

An embodiment of the present invention will hereinafter be described with reference to the drawings.

A. External Appearance and Entire Structure

Figure 1A:
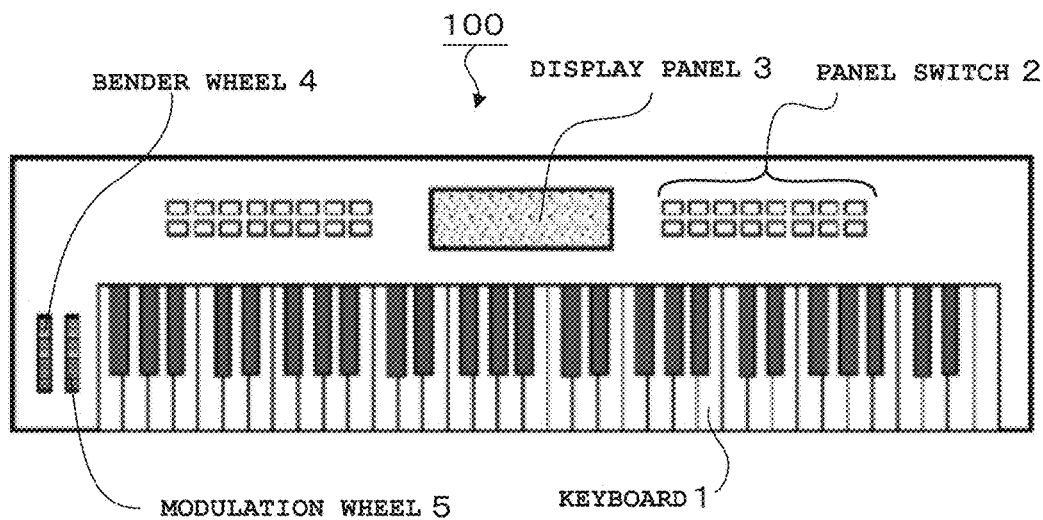
FIG. 1A is an external view of an electronic keyboard instrument 100 according to an embodiment of the present invention and FIG. 1B is a block diagram showing the electric structure of the electronic keyboard instrument 100.
Figure 1B:
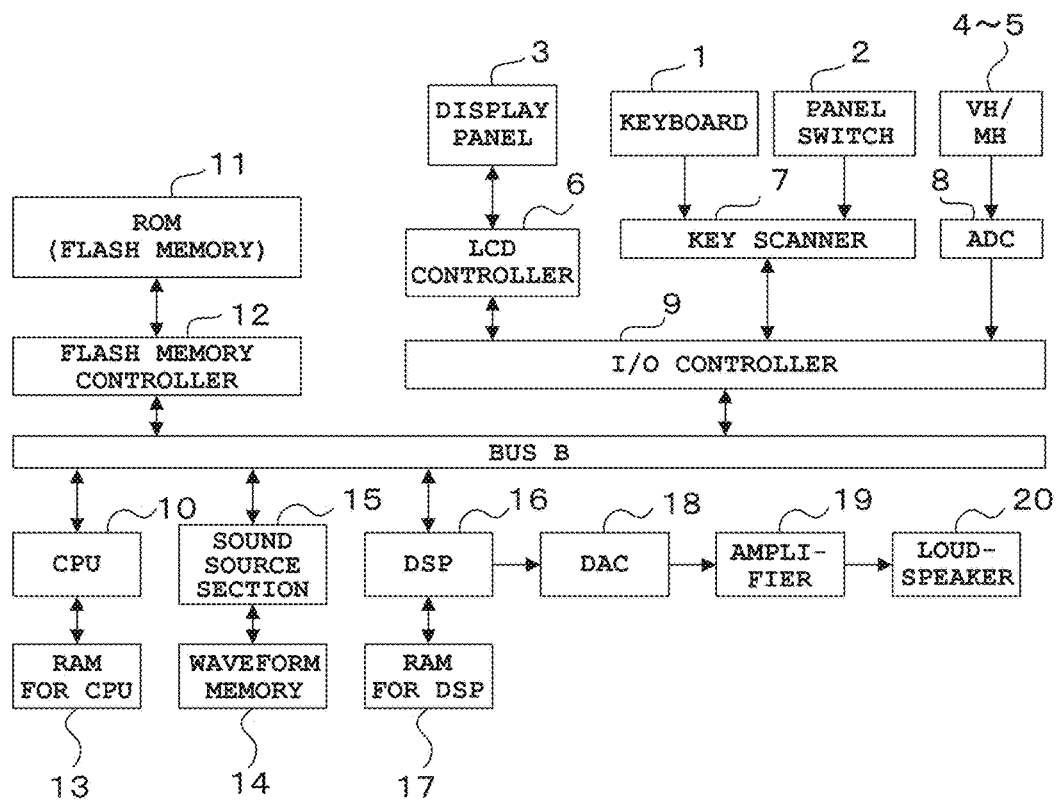

The external appearance and the entire structure of the embodiment are described with reference to FIG. 1A and FIG. 1B. FIG. 1A is an external view of an electronic keyboard instrument 100 according to the embodiment of the present invention, and FIG. 1B is a block diagram showing the electric structure of the electronic keyboard instrument 100.

In these drawings, a keyboard 1 is arranged in the longitudinal direction of an instrument housing having a rectangular parallelepiped appearance, and generates a signal in accordance with musical performance input (key depressing/releasing operation). The signal generated by the keyboard 1 is detected by a key scanner 7 for key scanning, and acquired by a CPU 10 via an I/O controller 9.

In the CPU 10, the signal generated by the keyboard 1 is acquired to generate musical performance input information. The musical performance input information includes a key-on/key-off signal representing a key depressing/releasing operation, a key number, a velocity, and the like. This musical performance input information is converted into musical performance data represented by a note-on/note-off event in MIDI format, and then supplied to a sound source section 15.

On the operation panel surface of the instrument housing, a panel switch 2 is arranged. The panel switch 2 includes, for example, a power supply switch for power-on/power-off of a device power supply as well as various operation switches such as a reverb type switching switch for selecting a desired reverberation characteristic. The event of each operation switch generated by the panel switch 2 is detected by the key scanner 7, and acquired by the CPU 10 via the I/O controller 9.

Also, on the operation panel surface of the instrument housing, a display panel 3 is arranged. On the display panel 3 constituted by an LCD panel, a display control signal generated by the CPU 10 is supplied via the I/O controller 9 to an LCD controller 6, whereby the screen display of, for example, the setting status or the operation status of each section of the musical instrument is performed.

On the left side of the operation panel of the instrument housing, a bender wheel (VH) 4 and a modulation wheel (MH) 5 are arranged. The bender wheel 4 generates a bender output in accordance with a wheel rotating operation by a user (performer). The modulation wheel 5 generates a modulation output in accordance with a wheel rotating operation by the user (performer).

The bender output and the modulation output are AD-converted by an AD converter (ADC) 8, and then acquired by the CPU 10 via the I/O controller 9. The bender output acquired by the CPU 10 is used as a pitch bend for smooth pitch control to a high-pitched sound side or low-pitched sound side centering on the pitch of a sound being emitted. On the other hand, the modulation output acquired by the CPU 10 is used as a value for specifying a depth of a modulation effect.

Figure 2A:
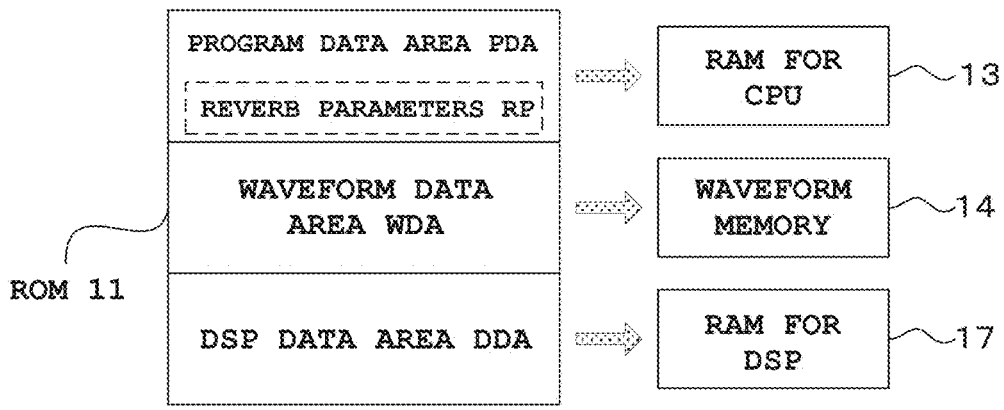
FIG. 2A is a memory map showing the data structure of a ROM (Read Only Memory) 11 and FIG. 2B is a memory map showing the data structure of a RAM 13 (Random Access Memory) for a CPU (Central Processing Unit)

The I/O controller 3 controls inputs/outputs of each of the above-described devices (the LCD controller 6, the key scanner 7, and the ADC 8) for data exchange. A ROM 11 in FIG. 1B is constituted by, for example, a flash memory known as a non-volatile memory, and includes a program data area PDA, a waveform data area WDA, and a DSP data area DDA shown in FIG. 2A.

In the program data area PDA of the ROM 11, various control programs to be executed by the CPU 10 and control data therefor are stored. In the present embodiment, when a DSP 16 described below is to function as a reverberator for adding a reverberation effect, the CPU 10 sets a reverberation characteristic of the DSP 16 (reverberator) by following reverb parameters RP. Accordingly, the reverb parameters RP that are used as control data are stored in the program data area PDA.

Figure 2B:
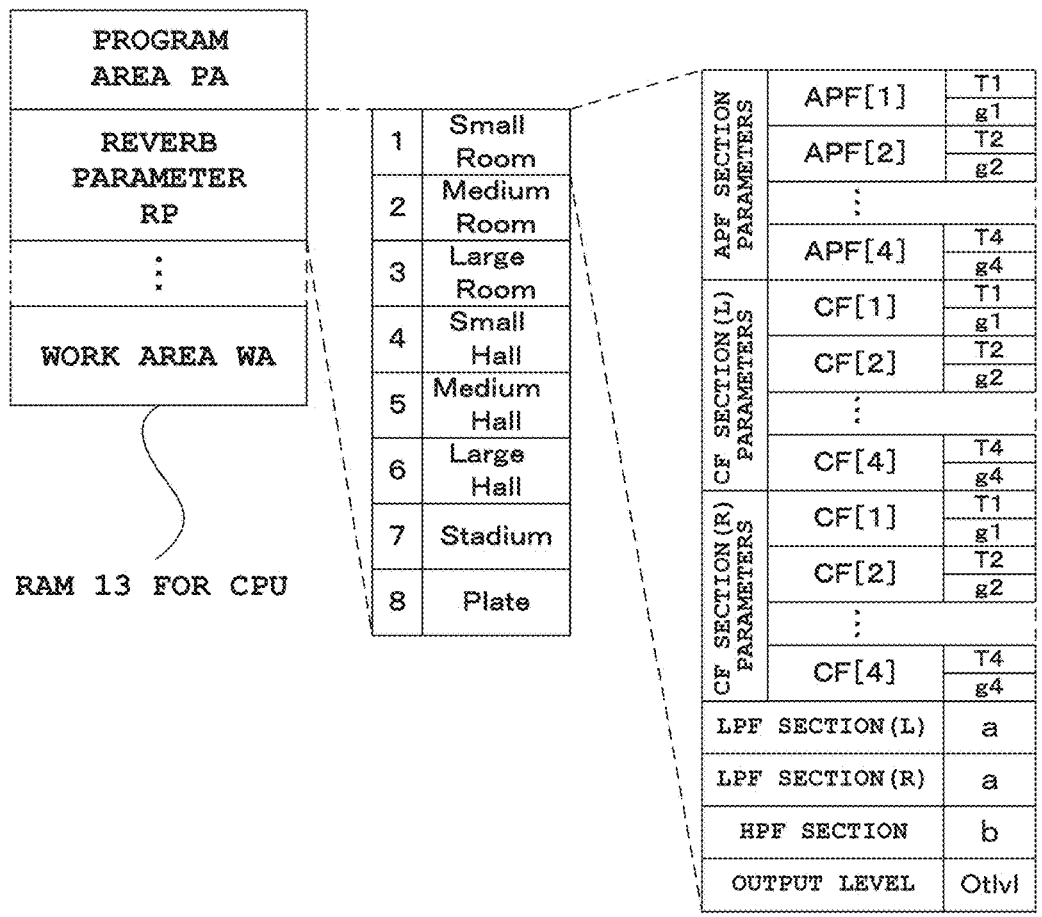

The reverb parameters RP set reverberation characteristics (such as a delay time and reverberation time of a reverberation sound) of eight different sound fields such as "small room" and "medium room". Specifically, as shown in FIG. 2B, the reverb parameters RP of eight reverb types are provided, and one of them is selected by the reverb type switching switch.

The reverb parameter RP of each reverb type includes an APF section parameter, a CF section (L) parameter, a CF section (R) parameter, an LPF section (L) parameter, an LPF section (R) parameter, an HPF section parameter, and an output level. These parameters each include a coefficient (gain) and a delay time that are supplied to each section of a reverberator (described further below) actualized by a microprogram executed by the DSP 16, which will be described in detail further below.

In initialization processing executed by the CPU 10 at the time of startup (this processing will be described further below), these various control programs and control data (including the reverb parameters RP) stored in the program data area PDA of the ROM 11 are transferred from the program data area PDA of the ROM 11 via a flash memory controller 12 to a RAM 13 for the CPU.

In the waveform data area WDA of the ROM 11, the waveform data of various tones is stored. In the initialization processing executed by the CPU 10 at the time of startup (this processing will be described further below), this waveform data is read from the waveform data area WDA via the flash memory controller 12 and then transferred to a waveform memory 14.

In the DSP data area WDA of the ROM 11, various programs that can be executed by the DSP 16, their corresponding parameter data, and the like are stored. Among these various microprograms, parameter data, and the like, an effect-related microprogram to be executed by the DSP 16 and parameter data are read via the flash memory controller 12 under the control of the CPU 10. The microprogram read out from the DSP data area WDA is written in the DSP 16 under the control of the CPU 10.

In the waveform memory 14, the waveform data of various tones read out by the CPU 10 from the waveform data area WDA (refer to FIG. 2A) of the ROM 11 described above is stored. The sound source section 15 is configured using a known waveform memory reading method, and includes a plurality of sound-emission channels. This sound source section 15 generates musical sound data by using the waveform data of a tone specified by the CPU 10 among the waveform data of various tones stored in the waveform memory 14.

That is, in response to a note-on event, the sound source section 15 assigns a sound-emission channel that is in an unassigned state, reads out from the waveform memory 14 the waveform data of a tone specified by the CPU 10 at a phase velocity corresponding to a sound-emission pitch (pitch specified by the key number of a depressed key) to form musical sound data, and stops (mutes) the formed musical sound data at the time of a note-off event.

The DSP 16 that is a processor dedicated for waveform arithmetic processing provides a predetermined effect (sound effect) to musical sound data generated by the sound source section 15. This effect (sound effect) to be provided by the DSP 16 is defined by the microprogram and the control data read out from the RAM 17 for the DSP. In the present embodiment, the DSP 16 functions as a reverberator which provides a reverberation effect to musical sound data generated by the sound source section 15. The configuration of the reverberator that is actualized by the DSP 16 will be described further below.

A DA converter (DAC) 18 in FIG. 1B DA-converts musical data provided with a predetermined effect by the DSP 16 into a musical sound signal in an analog signal format and outputs it to the next stage. An amplifier 19 in FIG. 1B removes unnecessary noise from the musical sound signal outputted from the DA converter 18 and then amplifies the signal at a predetermined level. A loudspeaker 20 in FIG. 1B emits the musical sound of the musical sound signal amplified by the amplifier 19 at the predetermined level.

B. Configuration of Reverberator

Figure 3:
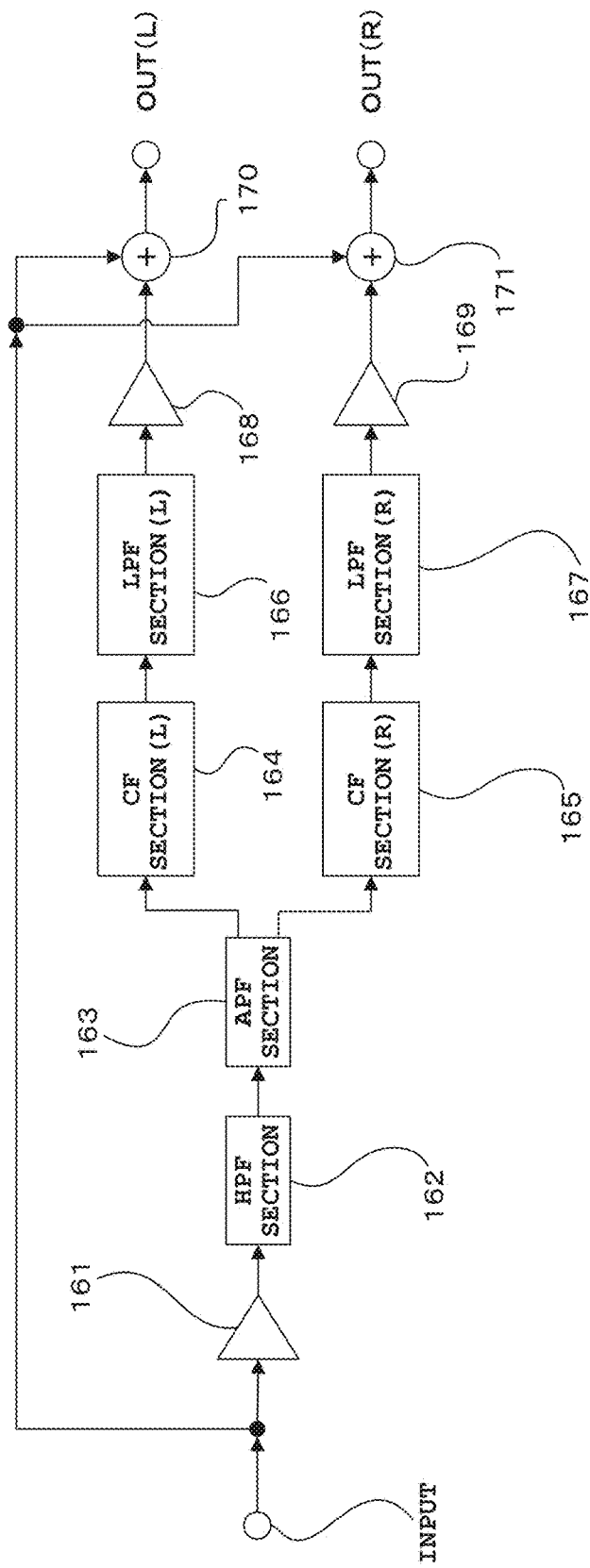
FIG. 3 is a block diagram showing the configuration of a reverberator actualized by a microprogram executed by a DSP 16.

FIG. 3 is a block diagram showing the functional configuration of the reverberator actualized by the microprogram executed by the DSP 16. The reverberator shown in the drawing outputs, based on a reverberation algorithm called the Schroeder type, a stereo output OUT(L) of a left channel component and a stereo output OUT(R) of a right channel component acquired by a reverberation sound being added to a musical sound signal INPUT (musical sound data) inputted from the sound source section 15.

Next, the configuration of the reverberator is described with reference to FIG. 3. The musical sound signal INPUT (musical sound data) generated by the sound source section 15 is inputted to a multiplier 161 and is also inputted to the adders 170 and 171 on a subsequent stage. The multiplier 161 amplifies the musical sound signal INPUT at a predetermined level and supplies the resultant signal to a high-pass filter (HPF) section 162. The high-pass filter (HPF) section 162 cuts off an unnecessary low-frequency component from the output from multiplier 161.

Figure 4A:
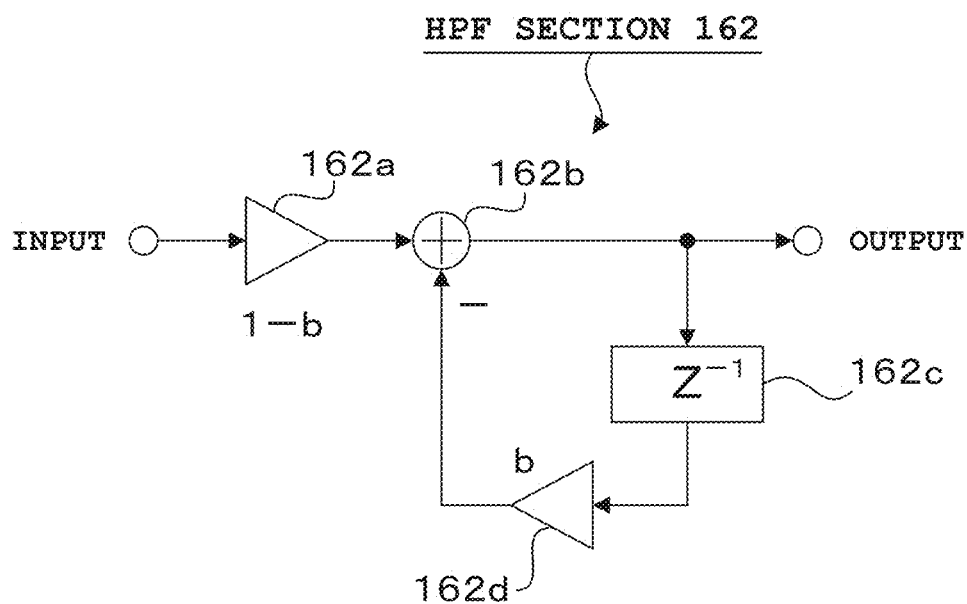
FIG. 4A is a block diagram showing the structure of a high-pass filter HPF section 162 and FIG. 4B is a block diagram showing the structure of a low-pass filter LPF section 166.

The high-pass filter (HPF) section 162 is constituted by a multiplier 162a, a subtractor 162b, a delay element 162c, and a multiplier 162, as shown in FIG. 4A. For example, in a case where the high-pass filter (HPF) section 162 is constituted by a primary recursive type, the multiplier 162a multiples an input signal by a gain (coefficient) 1-b for output. The subtractor 162b subtracts a one-sample delay output from the output from the multiplier 162b for output. The delay element 162c delays the output from the subtractor 162b by one sample for output. The multiplier 162d multiplies the output from the delay element 162c by a gain (coefficient) b to control the level of the one-sample delay output. Note that the gain (coefficient) b to be provided to the multiplier 162d is an HPF section parameter that is read out from the reverb parameters RP (refer to FIG. 2B) in various amplification-related switching processing performed by the CPU 10 in accordance with switching of a reverb type (refer to FIG. 12), which will be described further below.

An all-pass filter (APF) section 163 in FIG. 3 functions as a circuit element which simulates an initial dispersion process of a reverb sound. The configuration of this all-pass filter (APF) section 163 will be described further below. An output from the all-pass filter (APF) section 163 is converted by a comb filter (CF) section (L) 164 and a comb filter (CF) section (L) 165 into a stereo signal type of left and right channels. The all-pass filter (APF) section 163 functions as a circuit element which simulates random reflection of a reverb sound and a dispersion process thereof on these left and right channels. As the configurations of the comb filter (CF) section (L) 164 and the comb filter (CF) section (R) 165, the configuration of the comb filter (CF) section (L) 164 will be taken as an example and described further below.

A low-pass filter (LPF) section (L) 166 and a low-pass filter (LPF) section (R) 167 in FIG. 3 adjust the sound quality of each reverberation sound for a left channel output from the comb filter (CF) section (L) 164 and a right channel output from the comb filter (CF) section (R) 165, respectively.

Figure 4B:
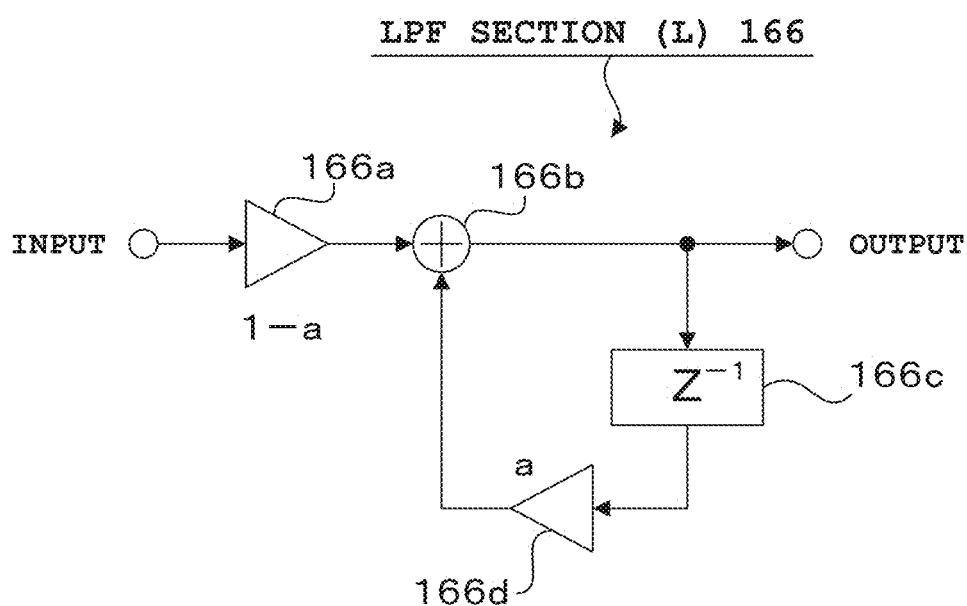

The low-pass filter (LPF) section (L) 166 is constituted by a multiplier 166a, an adder 166b, a delay element 166c, and a multiplier 166d, as shown in FIG. 4B. For example, in a case where the low-pass filter (LPF) section (L) 166 is constituted by a primary recursive type, the multiplier 166a multiples an input signal by a gain (coefficient) 1-a for output. The adder 166b adds a one-sample delay output to the output from the multiplier 166b for output. The delay element 166c delays the output from the adder 166b by one sample for output. The multiplier 166d multiplies the output from the delay element 166c by a gain (coefficient) a to control the level of the one-sample delay output.

This gain (coefficient) a to be provided to the multiplier 166d is an LPF section parameter of the above-described reverb parameters RP (refer to FIG. 2B). The CPU 10 smoothly changes the value to a target value by interpolating the gain (coefficient) a. This interpolation is performed by the CPU 10 in the various amplification-related switching processing (refer to FIG. 12) described further below.

A multiplier 168 in FIG. 3 adjusts the level of a left channel reverberation sound whose sound quality has been adjusted by the low-pass filter (LPF) section (L) 166 so as to perform static control. Similarly, a multiplier 169 in FIG. 3 adjusts the level of a right channel reverberation sound whose sound quality has been adjusted by the low-pass filter (LPF) section (R) 167 so as to perform static control. The multipliers 168 and 169 which adjust the levels of the left and right channels to perform static control are provided with an output level Otlvl. The output level Otlvl is a parameter to be read out from the above-described reverb parameters RP (refer to FIG. 2B) in the various amplification-related switching processing performed by the CPU 10 in accordance with switching of a reverb type (refer to FIG. 12), which will be described further below.

An adder 170 in FIG. 3 adds a statically-controlled reverberation sound on the left channel to an original sound (the musical sound signal INPUT generated by the sound source section 15) so as to generate a stereo output OUT(L) of a left channel component. An adder 171 in FIG. 3 adds a statically-controlled reverberation sound on the right channel to an original sound (the musical sound signal INPUT generated by the sound source section 15) so as to generate a stereo output OUT(R) of a right channel component.

In the reverberator configured as described above, filters for signal amplification such as the high-pass filter (HPF) section 162/low-pass filter (LPF) section (L) 166 and low-pass filter (LPF) section (R) 167 are referred to as amplification-related filters. Among these amplification-related filters, a filter which includes a circulating section and a delay section not for the purpose of signal delay and has a very-short fixed delay time (for example, one sample time) is referred to as a primary recursive filter.

Also, as the all-pass filter (APF) section 163/comb filter (CF) section (L) 164 and comb filter (CF) section (R) 165, filters for the purpose of signal delay and having a long, variable delay time are referred to as delay recursive filters.

C. Configuration, of All-Pass Filter (APF) Section 163

Figure 5:
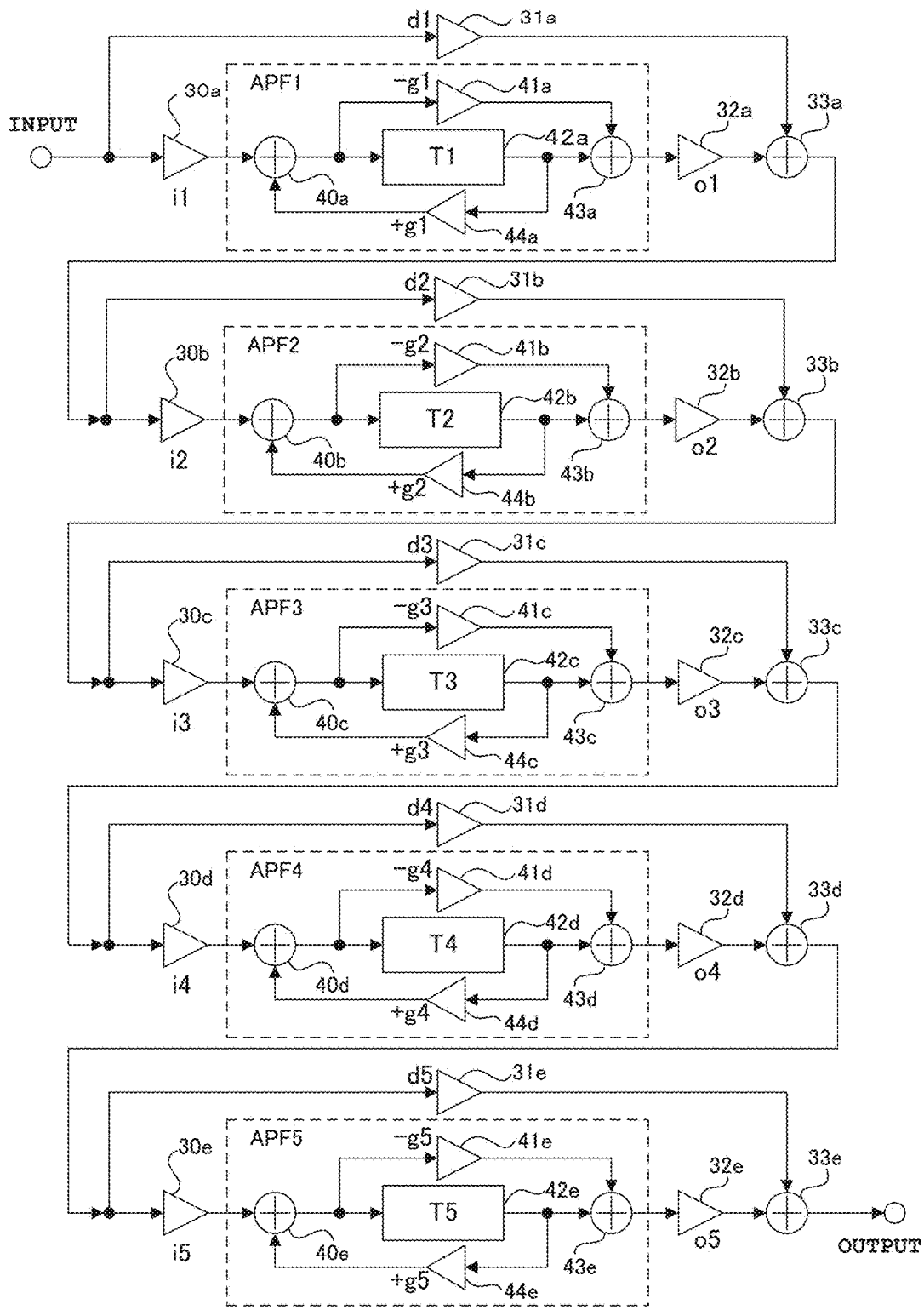
FIG. 5 is a block diagram showing the structure of an all-pass filter (APF) section 163.

Next, the configuration of the all-pass filter (APF) section 163 functioning as a circuit element which simulates an initial dispersion process of a reverberation sound is described with reference to FIG. 5. The all-pass filter (APF) section 163 is constituted by five all-pass filter blocks (which will be described further below) connected in series, as shown in FIG. 5. Here, all the all-pass filter blocks have the same configuration and therefore this configuration is described focusing on the configuration of the all-pass filter block at the first stage among the five all-pass filter blocks connected in series.

The all-pass filter block at the first stage includes an all-pass filter APF1 and a bypass crossfading section. The all-pass filter APF1 is a known primary recursive filter which repeatedly outputs an input signal in a predetermined cycle (delay time T1) while attenuating the input signal, and has an adder 40a, an attenuator 41a, a delay element 42a, an adder 43a, and a multiplier 44a. The adder 40a adds a delay input to the input signal, and the attenuator 41a multiplies an output from the adder 40a by a gain (coefficient) −g1 for attenuation output. The delay element 42a delays and outputs the output from the adder 40a (delay time T1), and the adder 43a adds the attenuation output from the attenuator 41a to the delay output from the delay element 42a. The multiplier 44a multiplies the delay output from the delay element 42a by a gain (coefficient) +g1 for output.

Note that the crossfading described below is processing of gradually degreasing (fading-out) effects from any of a plurality of filters connected in series or parallel and gradually increasing (fading-in) effects from the other filters. To perform crossfading with the plurality of filters being connected in series, an effect of each individual filter is changed by bypass control.

The bypass crossfading section is a circuit for crossfading with the above-described plurality of filters being connected in series, and is constituted by a multiplier 30a, a multiplier 31a, a multiplier 32a, and an adder 33a. The multiplier 30a multiplies an input signal by a gain (coefficient) i1 for supply to the adder 40a of the all-pass filter APF1. The multiplier 31a outputs a direct input (a signal not via the above-described all-pass filter AP) acquired by multiplying the input signal by a gain (coefficient) d1. The multiplier 32a multiplies an all-pass output outputted from the adder 43a of the all-pass filter APF1 by a gain (coefficient) o1. The adder 33a adds a direct input outputted from the multiplier 31a and an all-pass output outputted from the multiplier 32a together for output to an all-pass filter block at the next stage.

In the bypass crossfading section configured as described above, when a bypass state is to be set in which no input signal is supplied to the all-pass filter APF1, the gain (coefficient) d1 of the multiplier 31a which outputs a direct input is set at "1", and the gain (coefficient) i1 of the multiplier 30a and the gain (coefficient) o1 of the multiplier 32a are set at "0". Also, when a filter output of the all-pass filter APF1 is to be set, the gain (coefficient) i1 of the multiplier 30a is set at "1", the gain (coefficient) d1 of the multiplier 31a is set at "0", and the gain (coefficient) of the multiplier 32a is set at "1".

As described above, all of the all-pass filter blocks have the same configuration. That is, an all-pass filter APF2 forming an all-pass filter block at the second stage is constituted by an adder 40b, a subtractor 41b, a delay element 42b, an adder 43b, and a multiplier 44b. Also, a bypass crossfading section forming the all-pass filter block at the second stage is constituted by a multiplier 30b, a multiplier 31b, a multiplier 32b, and an adder 33b.

Furthermore, an all-pass filter block at the third stage includes an all-pass filter APF3 constituted by components 40c, 41c, 42c, 43c, and 44c and a bypass crossfading section constituted by components 30c, 31c, 32c, and 33c. An all-pass filter block at the fourth stage includes an all-pass filter APF4 constituted by components 40d, 41d 42d, 43d, and 44d and a bypass crossfading section constituted by components 30d, 31d, 32d, and 33d. An all-pass filter block at the fifth stage includes an all-pass filter APF5 constituted by components 40e, 41e, 42e, 43e, and 44e and a bypass crossfading section constituted by components 30e, 31e, 32e, and 33e.

In the all-pass filter (APF) section 163, among the five all-pass filter blocks connected in series, four all-pass filter blocks are normally set to function as circuit components which simulate a reverberation-sound dispersion process, and the remaining one all-pass filter block is set as a backup system. When a change in delay time is required at the time of reverb type switching, the CPU 10 performs all-pass filter switching processing (which will be described further below).

As will be described in detail further below, in the all-pass filter switching processing, a modulo arithmetic expression (which will be described further below) is used to assign an M-th all-pass filter APF[M] which is caused to make a transition from "filter output to a bypass state" for each of switching stages 1 to 4 and an N-th all-pass filter APF[N] which is caused to make a transition "from a bypass state to filter output" from among the five all-pass filters.

Then, based on the assigned all-pass filters APF[M] and APF[N], parameters (delay time T, coefficient g) of the all-pass filter APF[N] read out from the reverb parameters RP (refer to FIG. 2B) are set to the all-pass filter APF[N] for parameter update. After a lapse of a transient period corresponding to the delay time T, crossfading by envelope multiplication is performed to cause the all-pass filter APF [M] to make a transition to a bypass state and cause the all-pass filter APF[N] to make a transition to filter output. This switching processing is performed for each of the switching stages 1 to 4.

D. Configuration of Comb Filter (CF) Section (L) 164

Next, the configuration of the comb filter (CF) section (L) 164 functioning as a circuit element which simulates random reflection of a reverb sound and a dispersion process thereof is described. The comb filter (CF) section (R) 165 has the same configuration as that of the comb filter (CF) section (L) 164, and therefore is not described herein.

Figure 6:
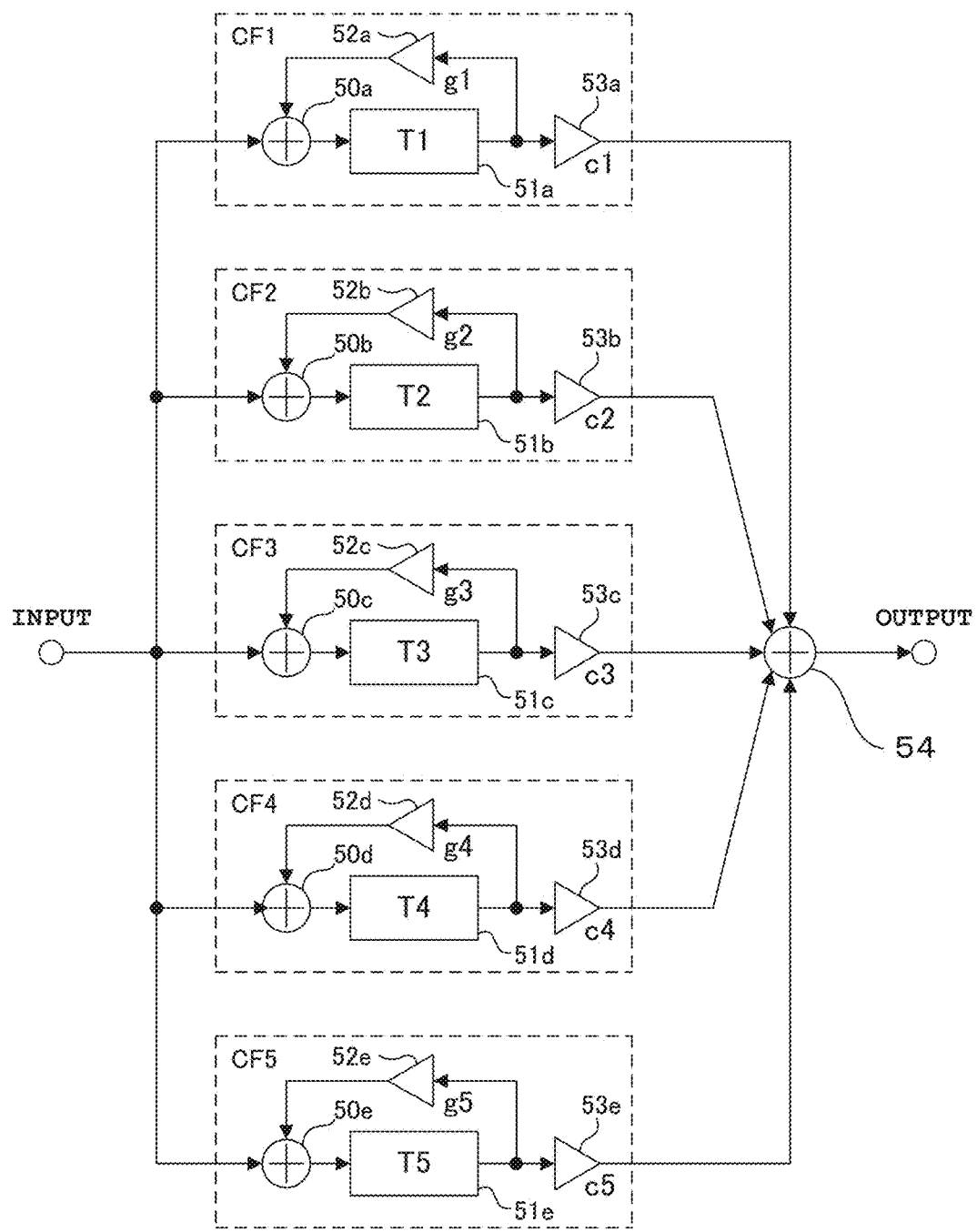
FIG. 6 is a block diagram showing the structure of a comb filter (CF) section (L) 164.

The comb filter (CF) section (L) 164 includes five comb filter blocks CF1 to CF5 connected in parallel and a mixer 54 which adds outputs from these comb filter blocks CF1 to CF5 together to generate a reverberation sound, as shown in FIG. 6. The comb filter block CF1 at the first stage connected in parallel is constituted by a comb filter CF1 and a multiplier 53a.

The comb filter CF1 is a known primary recursive filter which repeatedly outputs an input signal in a predetermined cycle (delay time) while attenuating the input signal, and includes an adder 50a, a delay element 51a, and a multiplier 52a. The adder 50a adds a delay input to the input signal, and the delay element 51a delays an output from the adder 50a for output (delay time T1). The multiplier 52a multiplies the output from the delay element 51a by a gain (coefficient) g1 for output, and a multiplier 53a multiplies the output from the comb filter CF1 by a gain (coefficient) c1 for supply to the mixer 54 at the subsequent stage. This mixer 54 functions as a circuit for crossfading with a plurality of filters being connected in parallel.

Note that the comb filter block CF2 at the second stage includes a comb filter CF2 constituted by an adder 50b, a delay element 51b, and a multiplier 52b, and a multiplier 53b which multiplies an output from this comb filter CF2 by a gain (coefficient) c2. Similarly, the comb filter block CF3 at the third stage includes a comb filter CF3 (an adder 50c, a delay element 51c, and a multiplier 52c) and a multiplier 53c which multiplies an output from the comb filter CF3 by a gain (coefficient) c3.

Also, the comb filter block CF4 at the fourth stage includes a comb filter CF4 (an adder 50d, a delay element 51d, and a multiplier 52d) and a multiplier 53d which multiplies an output from the comb filter CF4 by a gain (coefficient) c4. Furthermore, the comb filter block CF5 at the fifth stage includes a comb filter CF5 (an adder 50e, a delay element 51e, and a multiplier 52e) and a multiplier 53e which multiplies an output from the comb filter CF5 by a gain (coefficient) c5.

In the comb filter (CF) section (L) 164, among the five comb filter blocks CF1 to CF5 connected in parallel, four comb filter blocks are normally set to function as circuit components which simulate reflection of a left channel reverberation sound and a dispersion process thereof, and the remaining one comb filter block is set as a backup system. The same configuration applies to the comb filter (CF) section (R) 165.

When a change of the CF section (L)/CF section (R) parameters (refer to FIG. 2B) is required in accordance with reverb type switching, the CPU 10 performs comb filter switching processing (which will be described further below) to perform parameter update and switching of the comb filter blocks in both of the comb filter (CF) section (L) 164 and the comb filter (CF) section (R) 165.

The comb-filter switching processing is briefly described herein although its details will be described further below. A modulo arithmetic expression (which will be described further below) is used to assign an O-th comb filter block CF[O] which is caused to make a transition from "filter output to a bypass state" and a P-th comb filter block CF[P] which is caused to make a transition "from a bypass state to filter-output" from among the five comb filters connected in parallel.

Then, based on the assigned comb filter blocks CF[O] and CF[P], parameters (delay time T, coefficient g) from the reverb parameters RF (refer to FIG. 2B) are set to the comb filter block CF[P] for parameter update. After a lapse of a transient period corresponding to the delay time T, crossfading by envelope multiplication is performed to cause the comb filter block CF[O] to make a transition to a bypass state, and cause the comb filter block CF[P] to make a transition to filter output. This switching processing is performed for each of the switching stages 1 to 4.

As with the above-described all-pass filter (APF) section 163 and the comb filter (CF) section (L) 164, a filter constituted by a plurality of filter blocks (the all-pass filter blocks APF1 to APF5/the comb filter blocks CF1 to CF5) being combined so as to form a predetermined characteristic is referred to as a set filter.

Also, each of the plurality of filter blocks (all-pass filter blocks APF1 to APF5/the comb filter blocks CF1 to CF5) constituting the set filter is referred to as a partial filter.

E. Operation

Next, the main routine, the reverb switching processing called from the main routine, the all-pass filter switching processing forming the reverb switching processing (the all-pass filter assign processing and the all-pass filter delay time change processing), the comb filter switching processing (the comb filter assign processing and the comb filter delay time change processing), and the various amplification-related switching processing to be performed by the CPU 10 of the above-structured electronic keyboard instrument 100 are described with reference to FIG. 7 to FIG. 12. In the following descriptions of the operation, the subject of the operation is the CPU 10 unless otherwise specified.

1. Operation of Main Routine

Figure 7A:
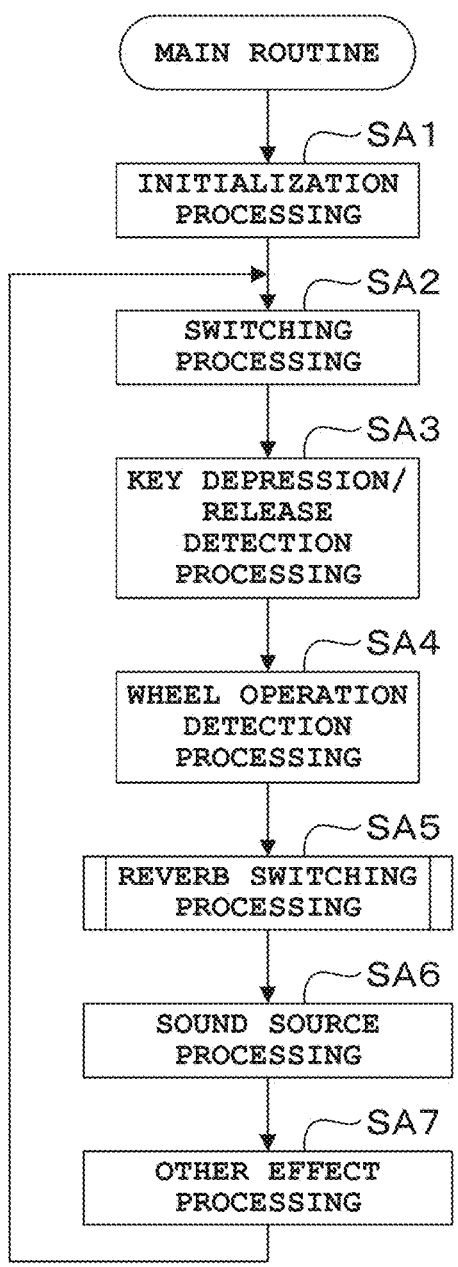
FIG. 7A is a flowchart of the operation of the main routine to be performed by a CPU 10 and FIG. 7B is a flowchart of the operation of reverb switching processing to be executed by the CPU 10.

FIG. 7A is a flowchart showing the operation of the main routine to be performed by the CPU 10. When the electronic keyboard instrument 100 is powered on, the CPU 10 performs the main routine, proceeds to Step SA1 shown in FIG. 7A, and performs initialization processing of initializing each section of the instrument. In this initialization processing, for example, the CPU 10 reads out various control programs and control data (including the reverb parameters RP) from the program data area PDA in the ROM 11 so as to transfer them to the RAM 13 for the CPU, transfers the waveform data of a predetermined tone read out from the waveform data area WDA of the ROM 11 to the waveform memory 14, and writes a predetermined microprogram, parameter data, and the like read out from the DSP data area WDA of the ROM 11 in the RAM 17 for the DSP.

Next, the CPU 10 proceeds to Step SA2, and performs switching processing corresponding to a switch event of a type generated by a user operation on the panel switch 2. For example, when the user operates the reverb type switching switch for selecting a reverberation characteristic, the CPU 10 performs switching processing of generating a reverb type change request and reading from the RAM 13 for the CPU the reverb parameter RP indicating the reverberation characteristic specified by that switch operation so as to display it on the display panel 3.

Then, at Step SA3, when a key-depressing operation is detected based on a scanning result of the key scanner 7 which scans each key of the keyboard 1, the CPU 10 performs key depression/release detection processing of generating a note-on event including a note number representing a pitch to be emitted, its velocity, and the like. On the other hand, when a key-releasing operation is detected, the CPU 10 generates a note-off event including a pitch to be muted.

Subsequently, at Step SA4, the CPU 10 performs wheel operation detection processing based on an output from the AD converter 8. In this wheel operation detection processing, when a bender output in accordance with a rotating operation on the bender wheel 4 by the user (performer) is detected, the CPU 10 instructs the sound source section 15 to make a pitch bend based on the bender output. On the other hand, when a modulation output in accordance with a rotating operation on the modulation wheel 5 is detected, the CPU 10 gives an instruction regarding the depth of a modulation effect based on the modulation output to the DSP 16 adding the modulation effect.

Next, at Step SA5, when the DSP 16 is functioning as the above-described reverberator, and the user (performer) operates the reverb type switching switch to generate a reverb type change request, the CPU 10 starts performing the reverb switching processing. Details of the reverb switching processing will be described further below. Note that, when the DSP 16 is not functioning as a reverberator and no reverb type change request has been generated, the CPU 10 does not perform the reverb switching processing at Step SA5, and proceeds to the next Step SA6.

Next, the CPU 10 proceeds to Step SA6, and performs sound source processing of sending a note-on event generated at Step SA3 described above to the sound source section 15 so as to instruct the sound source section 15 to emit a sound or sending a note-off event to instruct the sound source section 15 to mute the sound. The sound source section 15 generates musical sound data based on the note-on event supplied from the CPU 10 as described above, or stops the musical sound data based on the note-off event.

The reverb switching processing at Step SA5 is, in practice, repeatedly preformed concurrently and asynchronously with the sound source processing at Step SA6 (and each of Steps SA2 to SA4 and SA7). Even when the emission of a musical sound specified by the sound source processing is continuing, reverb switching is effective. That is, when reverb switching is performed while the emission of one musical sound is continuing, the filter effect can be gradually switched without unnaturalness in audibility within a period in which the emission of this musical sound is continuing.

Then, at Step SA7, when the DSP 16 can perform a function of adding any of various effects except the above-described reverberator, the CPU 10 performs another effect processing of adding any of various effects such as reverb, delay, echo, chorus, or the like to the musical sound data generated by the sound source section 15. The CPU 10 then returns to the above-described Step SA2, and repeats the processing at Steps SA2 to SA7 described above until the electronic keyboard instrument 100 is powered off.

2. Operation of Reverb Switching Processing

Figure 7B:
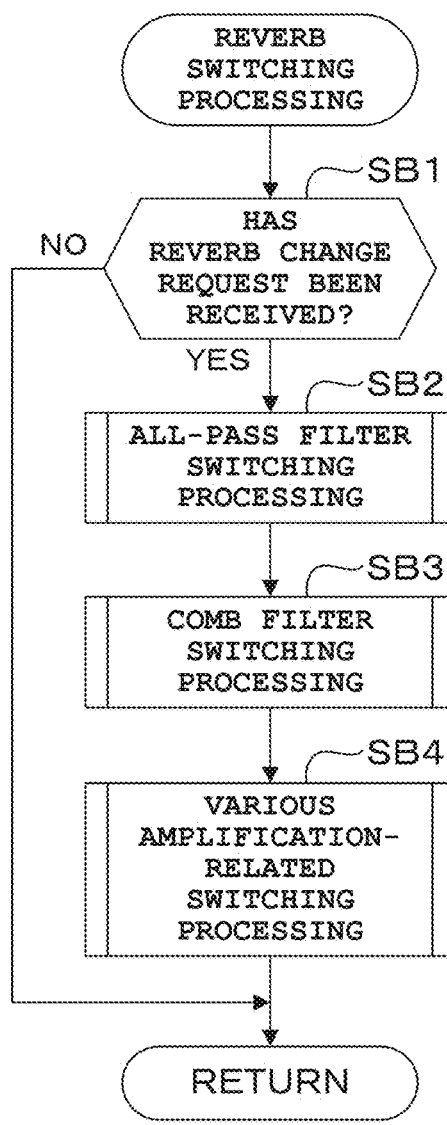
Figure 9:
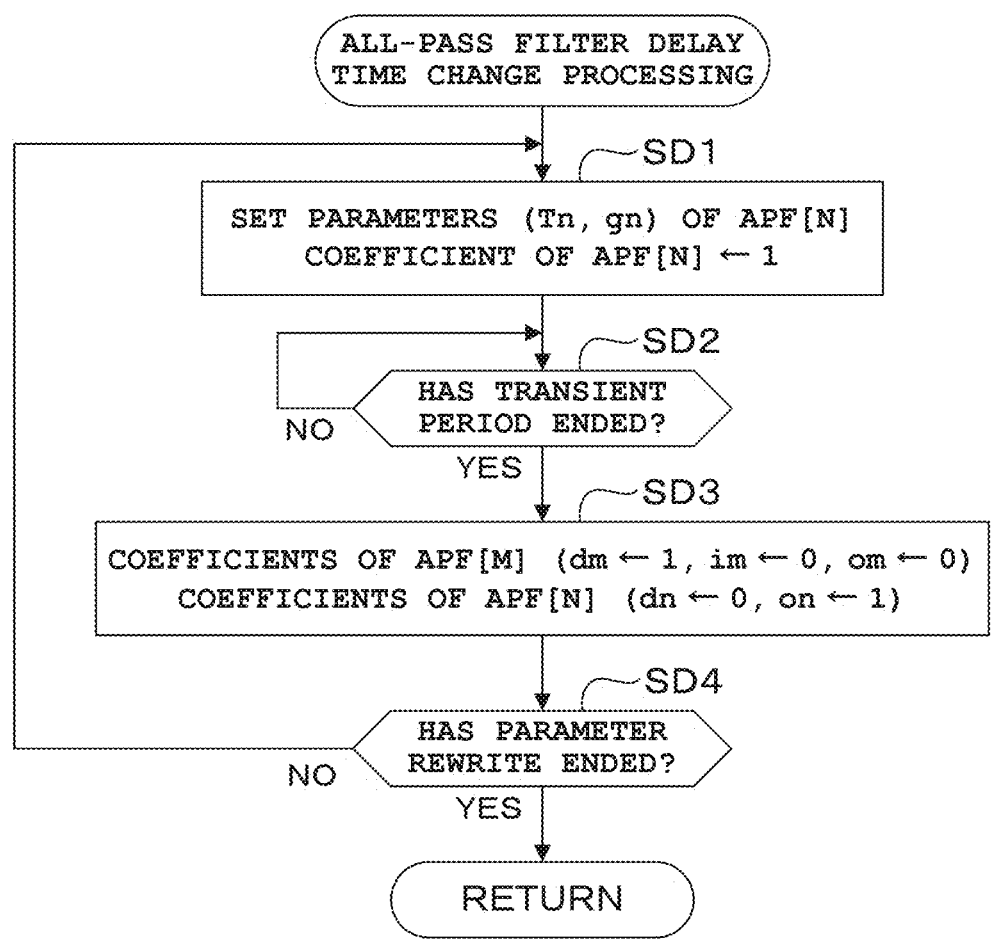
FIG. 9 is a flowchart of the operation of all-pass filter delay time change processing to be executed by the CPU 10.
Figure 11:
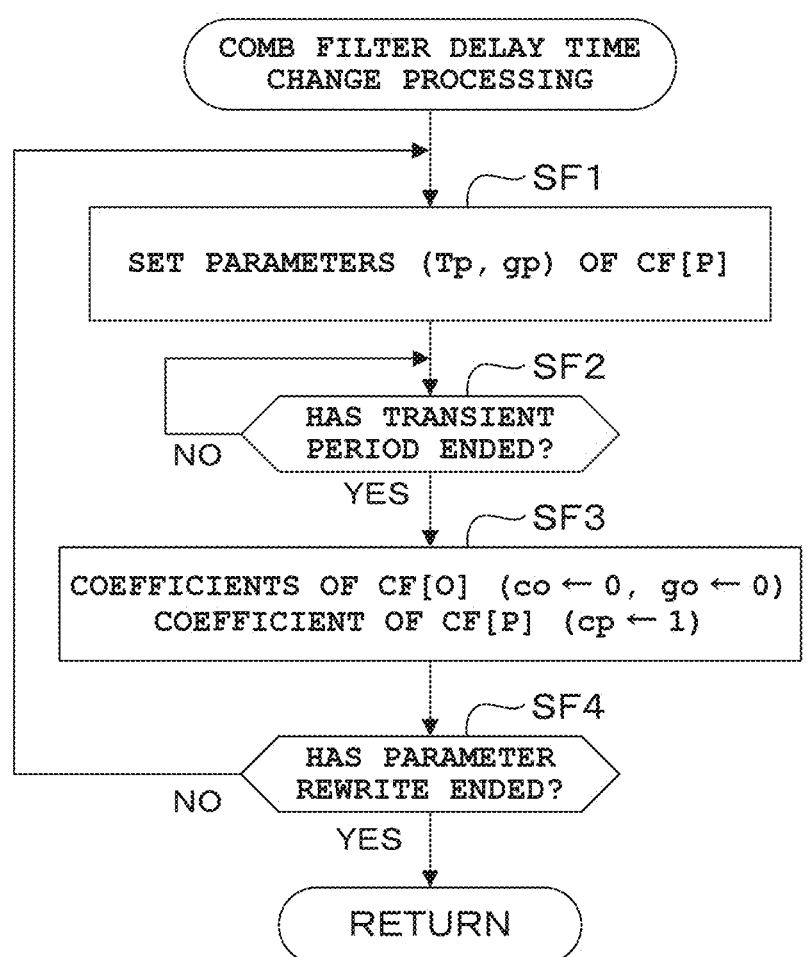
FIG. 11 is a flowchart of the operation of comb filter delay time change processing to be executed by the CPU 10.

Next, the operation of the reverb switching processing to be performed by the CPU 10 is described with reference to FIG. 7B. When the reverb switching processing indicated by Step SA5 of the above-described main routine (refer to FIG. 7A) (which is, in practice, repeatedly performed concurrently and asynchronously) is started, the CPU 10 starts the processing shown in FIG. 7B to proceed to Step SB1. At Step SB1, the CPU 10 judges whether a reverb change request has been received, that is, whether the user (performer) has operated the reverb type switching switch.

At Step SA2 of the above-described main routine, when the user (performer) has not operated the reverb type switching switch and no reverb type change request has been received, the judgment result at Step SB1 is "NO", and therefore the CPU 10 ends the reverb switching processing.

Conversely, at Step SA2 of the above-described main routine, when the user (performer) has operated the reverb type switching switch for selecting a reverberation characteristic to generate a reverb type change request, the judgment result at Step SB1 is "YES", and therefore the CPU 10 performs the all-pass filter switching processing via the next Step SB2.

When a reverb type change request is generated, a delay time from that time point is measured by a timer. Based on this measured timer value, the CPU 10 sequentially judges the progress at each stage. At each stage, the processing at Steps SB2, SB3, and SB4 are concurrently and simultaneously performed.

(1) Operation of All-Pass Filter Switching Processing

Next, the operation of the all-pass filter switching processing is described with reference to FIG. 8A and FIG. 8B. When the all-pass filter switching processing is started via Step SB2 shown in FIG. 7B, the CPU 10 proceeds to Step SC1 shown in FIG. 8A, and performs the all-pass filter assign processing.

a. Operation of All-Pass Filter Assign Processing

As shown in FIG. 5, among the five all-pass filter blocks connected in series, the all-pass filter (APF) section 163 normally causes four all-pass filter blocks to function as circuit elements which simulate a reverberation sound dispersion process and causes the remaining one all-pass filter block to function as a backup system.

In the all-pass filter assign processing at Step SC1 shown in FIG. 8A, in accordance with the stage progress, the CPU 10 assigns an all-pass filter block which is caused to make a transition "from filter output to a bypass state" and an all-pass filter block which is caused to make a transition "from a bypass state to filter output" from among the five all-pass filter blocks connected in series.

Specifically, when the number of the all-pass filter which is caused to make a transition "from filter output to a bypass state" is "N" and the number of the all-pass filter which is caused to make a transition "from a bypass state to filter output" is "M", a relation therebetween can be represented by the following modulo arithmetic operation (residue arithmetic operation).

$$N=\mathrm{mod}(M+4,5) \tag{1}$$

To associate the numbers N and M with APF numbers (APF1 to APF5) of the all-pass filter blocks in the operation example shown in FIG. 8B, each of them is incremented by 1. That is, as the stage progresses, "N" and "M" change in a circulating manner within a range of the number of filters.

Here, a case is exemplarily described in which, in an example shown in FIG. 8B, reverb type switching is performed in a situation where the all-pass filter blocks APF1 to APF4 at the first stage to the fourth stage are caused to function and the all-pass filter block APF5 at the fifth stage is in a bypass state (unassigned).

In this case, when the number M of the all-pass filter block which is caused to make a transition "from filter output to a bypass state" at the initial switching stage 1 is set at "0:(APF1)", the number N of the all-pass filter block which is caused to make a transition "from a bypass state to filter output" is "4:(APF5)" based on the above equation (1).

Then, when the all-pass filter assign processing is performed corresponding to the operation example shown in FIG. 8B, the CPU 10 acquires assignment results (M, N) corresponding to the switching stages 1 to 4 based on the above equation (1) as described below, and the results are temporarily stored in a work area WA of the RAM 13 for the CPU.

Switching stage 1: APF1 (M=0)→APF5 (N=4)
Switching stage 2: APF2 (M=1)→APF1 (N=0)
Switching stage 3: APF3 (M=2)→APF (N=1)
Switching stage 4: APF4 (M=3)→APF3 (N=2)

b. All-Pass Filter Delay Time Change Processing

When the all-pass filter assign processing at Step SC1 is completed as described above, the CPU 10 performs the all-pass filter delay time change processing via the next Step SC2 (refer to FIG. 8A). When the all-pass filter delay time change processing is started, the CPU 10 performs processing at Step SD1 and the following processing shown in FIG. 9 for each of the switching stages 1 to 4.

<Operation of Switching Stage 1>

At Step SD1, the CPU 10 reads cut the parameters (delay time T5, coefficient g5) of the all-pass filter block APF5 (N=4) in a bypass state from the reverb parameters RP stored in the RAM 13 for the CPU. The CPU 10 then sets the delay time T5 to the delay element 42*e* (refer to FIG. 5) of the all-pass filter APF5 and sets a gain (coefficient) −g5 to the multiplier 41e and a gain (coefficient) +g5 to the multiplier 44e.

Here, since a gain (coefficient) i5 of the multiplier 30e and a gain (coefficient) o5 of the multiplier 32e of the all-pass filter block APF5 (N=4) are "0", the parameters (delay time T5, coefficient g5) of the all-pass filter APF5 can be updated without providing a delay change to the next stage. Then, when the update of the parameters (delay time T5, coefficient g5) is ended, the CPU 10 sets "1" to the gain (coefficient) i5 of the multiplier 30e of the all-pass filter block APF5 (N=4).

Subsequently, at Step SD2, the CPU 10 waits until a transient period corresponding to the delay time T5 set to the delay element 42e elapses. When the transient period elapses, the judgment result at Step SD2 is "YES", and therefore the CPU 10 proceeds to Step SD3. At Step SD3, by crossfading by envelope multiplication, the CPU 10 sets the gain (coefficient) d1 of the multiplier 31a at "1", sets the gain (coefficient) o1 of the multiplier 30a at "0", and sets the gain (coefficient) o1 of the multiplier 32a at "0" in the all-pass filter block APF1 (M=0). Also, the CPU 10 sets a gain (coefficient) d5 of the multiplier 31e at "0" and sets the gain (coefficient) o5 of the multiplier 32e at "1" in the all-pass filter block APF5 (N=4). This causes the "all-pass filter block APF1 (M=0)" to make a transition to a bypass state and causes the "all-pass filter block APF5 (N=4)" to make a transition to filter output.

This crossfading is performed based on the time value for judging the stage progress, and gradually changes the setting value such that crossfading is completed within a time period in which the stage is switched (note that a time until one crossfading is completed can be set across a plurality of stages).

Then, the CPU 10 proceeds to Step SD4, and judges whether parameter rewrite has been ended, that is, whether the processing has been performed for all of the above-described switching stages 1 to 4. If the processing has not been performed for all of the above-described switching stages 1 to 4, the judgment result is "NO", and therefore the CPU 10 returns to the above-described Step SD1. Thereafter, the CPU 10 repeats the above-described Steps SD1 to SD4 until the processing is performed for all of the switching stages 1 to 4.

Note that, to proceed to the next switching stage, the number M of the all-pass filter block which is caused to make a transition "from filter output to a bypass state" is incremented by one step, and then stored in a memory. Also, in the all-pass filter block APF[M] caused to make a transition to a bypass state by crossfading, the CPU 10 sets a gain (coefficient) im of the multiplier 30 at "0".

<Operation of Switching Stage 2>

At the switching stage 2, the CPU 10 reads out the parameters (delay time T1, coefficient g1) of the all-pass filter block APF1 (N=0) in a bypass state from the reverb parameters RP. The CPU 10 then sets the delay time T1 to the delay element 42a (refer to FIG. 5), sets the gain (coefficient) −g1 to the multiplier 41a, and sets the gain (coefficient) +g1 to the multiplier 44a in the all-pass filter APF1.

Here, since the gain (coefficient) i1 of the multiplier 30a and the gain (coefficient) o1 of the multiplier 32a of the all-pass filter block APF1 (N=0) are "0", the parameters (delay time T1, coefficient g1) of the all-pass filter APF1 can be updated without providing a delay change to the next stage. Then, when the update of the parameters is ended, the CPU 10 sets "1" to the gain (coefficient) i1 of the multiplier 30a of the all-pass filter block APF1 (N=0), and then waits until a transient period corresponding to the delay time T1 elapses.

When the transient period elapses, by crossfading by envelope multiplication, the CPU 10 sets a gain (coefficient) d2 of the multiplier 31b at "1", sets a gain (coefficient) i2 of the multiplier 30b at "0", and sets a gain (coefficient) o2 of the multiplier 32b at "0" in the all-pass filter block APF2 (M=0). Also, the CPU 10 sets the gain (coefficient) d1 of the multiplier 31a at "0" and sets the gain (coefficient) o1 of the multiplier 32a at "1" in the all-pass filter block APF1 (N=0). This causes the "all-pass filter block APF2 (M=1)" to make a transition to a bypass state and causes the "all-pass filter block APF1 (N=0)" to make a transition to filter output.

<Operation of Switching Stage 3>

At the switching stage 3, the CPU 10 reads out the parameters (delay time T2, coefficient g2) of the all-pass filter block APF2 (N=1) in a bypass state from the reverb parameters RP. The CPU 10 then sets the delay time T2 to the delay element 42b (refer to FIG. 5), sets a gain (coefficient) −g2 to the multiplier 41b, and sets a gain (coefficient) +g2 to the multiplier 44b in the all-pass filter APF2. Here, since the gain (coefficient) i2 of the multiplier 30b and the gain (coefficient) o2 of the multiplier 32b of the all-pass filter block APF2 (N=1) are "0", the parameters can be updated without providing a delay change to the next stage.

When the update of the parameters is ended, the CPU 10 sets "1" to the gain (coefficient) i2 of the multiplier 30b of the all-pass filter block APF2 (N=1), and then waits until a transient period corresponding to the delay time T2 elapses. When the transient period elapses, by crossfading by envelope multiplication, the CPU 10 sets a gain (coefficient) d3 of the multiplier 31c at "1", sets a gain (coefficient) i3 of the multiplier 30c at "0", and sets a gain (coefficient) o3 of the multiplier 32c at "0" in the all-pass filter block APF3 (M=2). Also, the CPU 10 sets the gain (coefficient) d2 of the multiplier 31b at "0" and sets the gain (coefficient) o2 of the multiplier 32b at "1" in the all-pass filter block APF2 (N=1). This causes the "all-pass filter block APF3 (M=2)" to make a transition to a bypass state and causes the "all-pass filter block APF2 (N=1)" to make a transition to filter output.

<Operation of Switching Stage 4>

At the switching stage 4, the CPU 10 reads out the parameters (delay time T3, coefficient g3) of the all-pass filter block APF3 (N=2) in a bypass state from the reverb parameters RP. The CPU 10 then sets the delay time T3 to the delay element 42c (refer to FIG. 5), sets a gain (coefficient) −g3 to the multiplier 41c, and sets a gain (coefficient) +g3 to the multiplier 44c in the all-pass filter APF3. Here, since the gain (coefficient) i3 of the multiplier 30c and the gain (coefficient) o3 of the multiplier 32c of the all-pass filter block APF3 (N=2) are "0", the parameters can be updated without providing a delay change to the next stage.

When the update of the parameters is ended, the CPU 10 sets "1" to the gain (coefficient) i3 of the multiplier 30c of the all-pass filter block APF3 (N=2), and then waits until a transient period corresponding to the delay time T3 elapses. When the transient period elapses, by crossfading by envelope multiplication, the CPU 10 sets a gain (coefficient) d4 of the multiplier 31d at "1", sets a gain (coefficient) i4 of the multiplier 30d at "0", and sets a gain (coefficient) o4 of the multiplier 32d at "0" in the all-pass filter block APF4 (M=3). Also, the CPU 10 sets the gain (coefficient) d3 of the multiplier 31c at "0" and sets the gain (coefficient) o3 of the multiplier 32c at "1" in the all-pass filter block APF3 (N=2). This causes the "all-pass filter block APF4 (M=3)" to make a transition to a bypass state and causes the "all-pass filter block APF3 (N=2)" to make a transition to filter output.

When the processing at all the switching stages 1 to 4 is ended, the judgment result at Step SD4 is "YES". Therefore, after ending the processing, the CPU 10 proceeds to the next Step SB3 to perform the comb filter switching processing.

(3) Operation of Comb Filter Switching Processing

Next, the operation of the comb filter switching processing is described with reference to FIG. 10A and FIG. 10B. When the comb filter switching processing is started via Step SB3 shown in FIG. 7B, the CPU 10 proceeds to Step SE1 shown in FIG. 10A, and performs comb filter assign processing.

The comb filter assign processing is performed on both of the comb filter (CF) section (L) 164 which simulates random reflection of a reverberation sound and a dispersion process thereof on the left channel and the comb filter (CF) section (R) 165 which simulates random reflection of a reverberation sound and a dispersion process thereof on the right channel. However, here, only the comb filter switching processing to be performed in the comb filter (CF) section (L) 164 is described for simplification of description.

a. Operation of Comb Filter Assign Processing

In the comb filter assign processing, from among the five comb filter blocks connected in parallel, a comb filter block which is caused to make a transition "from filter output to a bypass state" and a comb filter block which is caused to make a transition "from a bypass state to filter output" are assigned in accordance with the stage progress.

Specifically, as with the above-described all-pass filter assign processing (refer to FIG. 8A), when the number of the comb filter CF which is caused to make a transition "from filter output to a bypass state" is "O" and the number of the comb filter CF which is caused to make a transition "from a bypass state to filter output" is "P", a relation therebetween can be represented by the following modulo arithmetic operation (1) described above (O=mod(P+4, 5)). Note that, to associate the numbers [O] and [P] with numbers CF1 to CF5 of the comb filter blocks in the operation example shown in FIG. 10B, each of them is incremented by "1". That is, as the stage progresses, "O" and "P" change in a circulating manner within a range of the number of filters.

Here, a case is exemplarily described in which, in an example shown in FIG. 10B, reverb type switching is performed in a situation where the comb filter blocks CF1 to CF4 at the first stage to the fourth stage connected in parallel are caused to function and the comb filter block CF5 at the fifth stage is in a bypass state (unassigned).

In this case, when the number P of the comb filter block which is caused to make a transition "from filter output to a bypass state" at the initial switching stage 1 is set at "0: (CF1)", the number P of the comb filter block which is caused to make a transition "from a bypass state to filter output" is "4: (CF5)" based on the above equation (1).

Then, when the comb filter assign processing is performed corresponding to the operation example shown in FIG. 10B, the CPU 10 acquires assignment results (O, P) corresponding to the switching stages 1 to 4 base on the above equation (1) as described below, and the results are temporarily stored in the work area WA of the RAM 13 for the CPU.

Switching stage 1: CF1 (O=0)→CF5 (P=4)
Switching stage 2: CF2 (O=1)→CF1 (P=0)
Switching stage 3: CF3 (O=2)→CF2 (P=1)
Switching stage 4: CF4 (O=3)→CF3 (P=2)

b. Comb Filter Delay Time Change Processing

When, the comb filter assign processing at Step SE1 is completed as described above, the CPU 10 performs the comb filter delay time change processing via the next Step SE2 (refer to FIG. 10A). When the comb filter delay time change processing is started, the CPU 10 proceeds to Step SF1 shown in FIG. 11. In the following descriptions, the operations of the present processing to be performed at the above switching stages 1 to 4 are described.

<Operation of Switching Stage 1>

At Step SF1, the CPU 10 reads out the parameters (delay time T5, coefficient g5) of the comb filter block CF5 (P=4) in a bypass state from the reverb parameters RP stored in the RAM 13 for the CPU. The CPU 10 then sets the delay time T5 to the delay element 51e (refer to FIG. 6) of the comb filter CF5 and sets the gain (coefficient) +g5 to the multiplier 52e. Here, since the gain (coefficient) c5 of the multiplier 53e is "0", the parameters (delay time T5, coefficient g5) of the comb filter CF5 can be updated without providing a delay change to the outside.

Next, at Step SF2, the CPU 10 waits until a transient period corresponding to the delay time T5 set to the delay element 51e elapses. When the transient period elapses, the judgment result at Step SF2 is "YES", and therefore the CPU 10 proceeds to Step SF3. At Step SF3, by crossfading by envelope multiplication, the CPU 10 sets the gain (coefficient) c1 of the multiplier 53a at "0" and sets the gain (coefficient) g1 of the multiplier 52a at "0" in the comb filter block CF1 (O=0). Also, the CPU 10 sets the gain (coefficient) c5 of the multiplier 53e at "1" in the comb filter block CF5 (P=4). This causes the "comb filter block CF1 (O=0)" to make a transition to a bypass state and causes the "comb filter block CF5 (P=4)" to make a transition to filter output.

Note that, as with the crossfading in the all-pass filters APF, crossfading in the all-pass filter APF is performed based on the timer value for judging the stage progress.

Then, the CPU 10 proceeds to Step SF4, and judges whether parameter rewrite has been ended, that is, whether the processing has been performed for all of the above-described switching stages 1 to 4. If the processing has not been performed for all of the above-described switching stages 1 to 4, the judgment result is "NO", and therefore the CPU 10 return to the above-described Step SF1. Thereafter, the CPU 10 repeats the above-described Steps SF1 to SF4 until the processing is performed for all of the switching stages 1 to 4.

Note that, to proceed to the next switching stage, the number O of the comb filter block which is caused to make a transition "from filter output to a bypass state" is incremented by one step, and then stored in a memory. Also, in the comb filter block CF[O] caused to make a transition to a bypass state by crossfading, the CPU 10 sets a gain (coefficient) io of the multiplier 53 at "0".

<Operation of Switching Stage 2>

At the switching stage 2, the CPU 10 reads out the parameters (delay time T1, coefficient g1) of the comb filter block CF1 (P=0) in a bypass state from the reverb parameters RP. The CPU 10 then sets the delay time T1 to the delay element 51a and sets the gain (coefficient) +g1 to the multiplier 52a in the comb filter CF1.

Here, since the gain (coefficient) c1 of the multiplier 53a of the comb filter block CF1 (P=0) is "0", the parameters (delay time T1, coefficient g1) of the comb filter CF1 can be updated without providing a delay change to the next stage.

Then, when the update of the parameters is ended, the CPU 10 waits until a transient period corresponding to the delay time T1 elapses.

When the transient period elapses, by crossfading by envelope multiplication, the CPU 10 sets the gain (coefficient) c2 of the multiplier 53b at "0" and sets the gain (coefficient) g2 of the multiplier 52b at "0" in the comb filter block CF2 (O=1). Also, the CPU 10 sets the gain (coefficient) c1 of the multiplier 53a at "1" in the comb filter block CF1 (P=0). This causes the "comb filter block CF2 (O=1)" to make a transition to a bypass state and causes the "comb filter block CF1 (P=0)" to make a transition to filter output.

<Operation of Switching Stage 3>

At the switching stage 3, the CPU 10 reads out the parameters (delay time T2, coefficient g2) of the comb filter block CF2 (P=1) in a bypass state from the reverb parameters RP. The CPU 10 then sets the delay time T2 to the delay element 51b and sets the gain (coefficient) +g2 to the multiplier 52b in the comb filter CF2.

Here, since the gain (coefficient) c2 of the multiplier 53b of the comb filter block CF2 (P=1) is "0", the parameters (delay time T2, coefficient g2) can be updated without providing a delay change to the outside. When the update of the parameters is ended, the CPU 10 waits until a transient period corresponding to the delay time T2 elapses.

When the transient period elapses, by crossfading by envelope multiplication, the CPU 10 sets the gain (coefficient) c3 of the multiplier 53c at "0", and sets the gain (coefficient) g3 of the multiplier 52c at "0" in the comb filter block CF3 (O=2). Also, the CPU 10 sets the gain (coefficient) c1 of the multiplier 53a at "1" in the comb filter block CF2 (p=1). This causes the "comb filter block CF3 (O=2)" to make a transition to a bypass state and causes the "comb filter block CF2 (P=1)" to make a transition to filter output.

<Operation of Switching Stage 4>

At the switching stage 4, the CPU 10 reads out the parameters (delay time T3, coefficient g3) of the comb filter block CF3 (P=2) in a bypass state from the reverb parameters RP. The CPU 10 then sets the delay time T3 to the delay element 51c, and sets the gain (coefficient) +g3 to the multiplier 52c in the comb filter CF3.

Here, since the gain (coefficient) c3 of the multiplier 53c of the comb filter block CF3 (P=2) is "0", the parameters (delay time T3, coefficient g3) of the comb filter CF3 can be updated without providing a delay change to the outside. When the update of the parameters is ended, the CPU 10 waits until a transient period corresponding to the delay time T3 elapses.

When the transient period elapses, by crossfading by envelope multiplication, the CPU 10 sets the gain (coefficient) c4 of the multiplier 53d at "0", and sets the gain (coefficient) g4 of the multiplier 52d at "0" in the comb filter block CF4 (O=3). Also, the CPU 10 sets the gain (coefficient) c2 of the multiplier 53b at "1" in the comb filter block CF3 (P=2). This causes the "comb filter block CF4 (O=3)" to make a transition to a bypass state and causes the "comb filter block CF3 (P=2)" to make a transition to filter output. When the processing at all the switching stages 1 to 4 is completed, the judgment result at Step SF4 is "YES". Therefore, after ending the processing, the CPU 10 proceeds to the next Step SB4 to perform the various amplification-related switching processing.

(4) Operation of Various Amplification-Related Switching Processing

Figure 12:
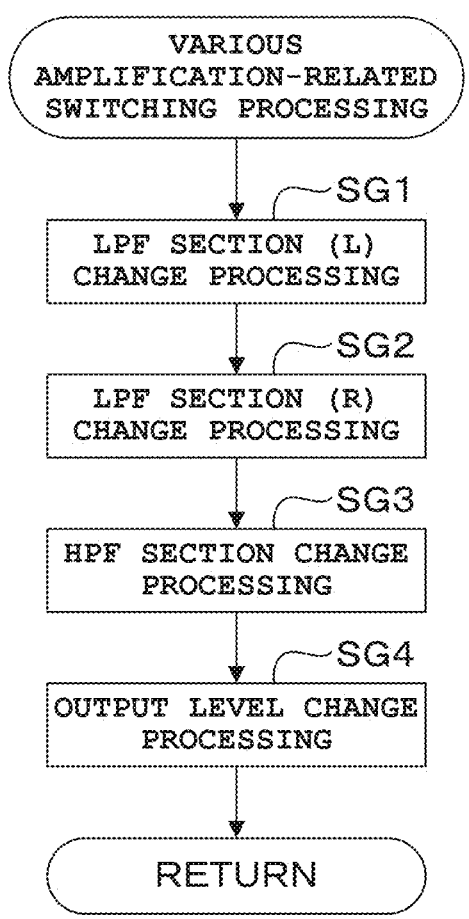
FIG. 12 is a flowchart of the operation of various amplification-related switching processing to be executed by the CPU 10.

Next, the operation of various amplification-related switching processing is described with reference to FIG. 12. When various amplification-related switching processing is performed via Step SB4 shown in FIG. 7B, the CPU 10 proceeds to Step SG1 shown in FIG. 12, and performs low-pass filter (LPF) section (L) change processing. In switching of various parameters in this amplification-related switching processing, the setting values are gradually changed based on the timer value for judging the stage progress such that parameter switching is completed within a stage switching time, as with the crossfading of the comb filter CF and the all-pass filter APF.

In the low-pass filter (LPF) section (L) change processing, in accordance with the switching of the reverb type, the CPU 10 reads out the gain (coefficient) a as an LPF section parameter from the reverb parameters RP (refer to FIG. 2B), and provides the gain (coefficient) a to the multiplier 166d of the low-pass filter (LPF) section (L) 166 (refer to FIG. 4B) and provides a gain (coefficient) 1-a to the multiplier 166a.

The CPU 10 then smoothly changes the value to a target value by interpolating the gain (coefficient) 1-a provided to the multiplier 166d and the gain (coefficient) 1-a provided to the multiplier 166a, which makes the delay output smoothly follow an input change so as to adjust the sound quality of the reverberation sound on the left channel output of the comb filter (CF) section (L) 164.

Next at Step SG2, the CPU 10 performs the low-pass filter (LPF) section (R) change processing. In this processing, in accordance with the switching of the reverb type, the CPU 10 reads out the gain (coefficient) a as an LPF section parameter from the reverb parameters RP (refer to FIG. 2B), and provides the gain (coefficient) a to the amplifier 167d of the low-pass filter (LPF) section (R) 167 and the gain (coefficient) 1-a to a multiplier 167a.

The CPU 10 then smoothly changes the value to a target value by interpolating the gain (coefficient) a provided to the multiplier 167d and the gain (coefficient) 1-a provided to the multiplier 167a, which, makes the delay output smoothly follow an input change so as to adjust the sound quality of the reverberation sound on the right channel output of the comb filter (CF) section (R) 165.

Next at Step SG3, the CPU 10 performs the high-pass filter (HPF) section change processing. In this processing, in accordance with the switching of the reverb type, the CPU 10 reads out a gain (coefficient) b as an HPF section parameter from the reverb parameters RP (refer to FIG. 2B), and provides the gain (coefficient) b to the multiplier 162c of the high-pass filter (HPF) section 162. Then, at the multiplier 162c, the CPU 10 gradually shifts the gain (coefficient) provided so far to the newly-provided gain (coefficient) b so as to smoothly change the delay output.

Then, at Step SG4, the CPU 10 performs the output level change processing. In this processing, in accordance with the switching of the reverb type, the CPU 10 reads out the output level Otlvl from the reverb parameters RP (refer to FIG. 2B), and provides the output level to the multipliers 168 and 169 (refer to FIG. 3) as their multiplication coefficients which adjust the level on the left and right channels for static control. Then, at each of the multipliers 168 and 169, the CPU 10 gradually shifts the output level provided so far to the newly-provided output level Otlvl so as to make a smooth output change.

As such, in the various amplification-related switching processing, interpolation is performed at amplification related components which generate characteristics of the high-pass filter HPF and the low-pass filters LPF, a reverberation time in accordance with a delay feedback input amount, a reverberation sound density, and a reverb output level, in accordance with reverb type switching, and a change to a target value is smoothly achieved.

As described above, in the above-described embodiment, the delay recursive filters (all-pass filters APF, comb filters CF) of the plurality of systems functioning as circuit elements which simulate reverberation-sound random reflection and dispersion based on the reverberation algorithm include at least one backup system. The delay recursive filters being used in the plurality of systems are switched one by one by crossfading to an unassigned delay recursive filter for which parameter setting has been performed, in accordance with reverb type switching. This processing is repeated as many as the number of delay recursive filters included in the plurality of systems, whereby switching to a desired reverberation characteristic is smoothly performed. As a result of this configuration, unnaturalness occurring when a filter characteristic is changed can be solved.

This unnaturalness occurring when a filter characteristic is changed can be solved by a method in which reverb processing functions of two systems capable of being concurrently performed are provided, and a reverberation sound corresponding to a reverb type before switching which occurs at one system and a reverberation sound corresponding to a reverb type after the switching which occurs at the other system are subjected to crossfading. However, this method is not practical because an extra processing system which causes more resource waste in cost is required to be provided. By contrast, the present embodiment has a merit in cost in that unnaturalness occurring when a filter characteristic is changed can be solved without causing resource waste.

The above-described embodiment is configured to omit input volumes (input multipliers) of the comb filter blocks CF1 to CF5 constituting each of the comb filter (CF) section (L) 164 which simulates random reflection of a reverberation sound and a dispersion process thereof on the left channel and the comb filter (CF) section (R) 165 which simulates random reflection of a reverberation sound and a dispersion process thereof on the right channel. However, the present invention is not limited thereto, and input volumes (input multipliers) equivalent to the multipliers 30a to 30e of the all-pass filter blocks APF1 to APF5 (refer to FIG. 5) may be provided. This circuit configuration can completely prevent a delay change to the outside.

Also, the all-pass filter assign processing (refer to Step SC1 of FIG. 8A) and the comb filter assign processing (refer to Step SE1 of FIG. 10A) in the above-described embodiment are merely examples of specific processing operations, and another assignment method may be adopted, such as a method of prioritizing and assigning a value closer to a target value between the current parameter value and a parameter value to be newly set or a method of changing the value stepwise when the change range of a parameter to be set is large.

Also, in the above-described embodiment, the control section which performs various control operations is actualized by the CPU (general-purpose processor) executing programs stored in the ROM (memory). However, a structure may be adopted in which the plural control operations are dividedly achieved by respective dedicated processors. In this structure, each dedicated processor may be constituted by a general-purpose processor (electronic circuit) which can execute a program and a control program tailored to each control, or may be constituted by a dedicated electronic circuit tailored to each program.

Also, in the above-described embodiment, the various filters are actualized by the digital circuit. However, they may be actualized by an analog circuit.

Furthermore, devices for acquiring the above-described various effects are not necessarily required to be structured as described above, and may be structured as follows.

(Structural Example 1)

A structure including:
a set filter which includes a plurality of partial filters and forms a specified characteristic by combining the plurality of partial filters; and
a processor which performs, as crossfading processing for a first filter and a second filter among the plurality of partial filters, fade-out processing of gradually decreasing a degree of contribution of the first filter to the characteristic and fade-in processing of gradually increasing a degree of contribution of the second filter to the characteristic, when an instruction is provided for changing the characteristic formed by the set filter.

(Structural Example 2)

The structure of Structural Example 1, in which the processor takes a partial filter used for characteristic formation before the instruction as the first filter, takes a partial filter not used for the characteristic formation before the instruction and associated with the characteristic indicated by the instruction as the second filter, and performs the crossfading processing such that a partial filter contributing to the characteristic is switched from the first filter to the second filter.

(Structural Example 3)

The structure of Structural Example 1, in which the set filter is constituted by the plurality of partial filters including at least one backup partial filter, and
in which the processor takes a partial filter used for characteristic formation before the instruction as the first filter, takes the backup partial filter as the second filter after setting a parameter corresponding to the characteristic indicated by the instruction to the backup partial filter, and performs the crossfading processing such that a partial filter contributing to the characteristic is switched from the first filter to the second filter.

(Structural Example 4)

The structure of Structural Example 3, in which the processor causes a characteristic that is set to the set filter to be selected from among a plurality of different characteristics, sets a parameter corresponding to the selected characteristic to the backup partial filter when an instruction for changing to the selected characteristic is provided, takes the backup partial filter as the second filter, and performs the crossfading processing such that the partial filter contributing to the characteristic is switched from the first filter to the second filter.

(Structural Example 5)

The structure of Structural Example 1, in which the plurality of partial filters is a plurality of delay recursive filters,
in which the set filter forms a predetermined reverberation characteristic by combining the plurality of delay recursive filters including at least one backup delay recursive filter, and
in which the processor, when an instruction for changing a reverberation characteristic of the set filter is provided, switches a delay recursive filter used for reverberation characteristic formation before the instruction among the delay recursive filters constituting the set filter to an unused delay recursive filter associated with the reverberation characteristic indicated by the instruction, by using crossfading.

(Structural Example 6)

The structure of Structural Example 1, in which the set filter is constituted by a delay recursive filter which includes a circulating section and a delay section and is capable of varying a delay time of a signal and an amplification-related filter which is different from the delay recursive filter and is incapable of varying the delay time of the signal, and in which the processor performs switching by the crossfading processing for the delay recursive filter, and performs, for the amplification-related filter, processing of gradually changing each parameter of the amplification-related filter without using the crossfading processing, (Structural Example 7)

The structure of Structural Example 1, in which the processor generates musical performance input information in accordance with a musical performance input operation and, when causing a sound source section to emit a musical sound in accordance with the generated musical performance input information, controls to emit the musical sound after adding a sound effect by the set filter.

(Structural Example 8)

A structure including:
- a characteristic formation section which includes a plurality of filters and forms a specified characteristic;
- a change instruction section which provides an instruction for changing the characteristic formed by the characteristic formation section; and
- a crossfading processing section which performs, as crossfading processing for a first filter and a second filter among the plurality of filters, fade-out processing of gradually decreasing a degree of contribution of the first filter to the characteristic and fade-in processing of gradually increasing a degree of contribution of the second filter to the characteristic, in response to the instruction from the change instruction section.

While the present invention has been described with reference to the preferred embodiments, it is intended that the invention be not limited by any of the details of the description therein but includes all the embodiments which fall within the scope of the appended claims.

What is claimed is:

1. A filter characteristics changing device comprising:
   a set of filters which includes a plurality of partial filters and which forms a characteristic by combining at least two filters selected from among the plurality of partial filters; and
   a processor which performs, as crossfading processing for a first filter and a second filter selected from among the plurality of partial filters, fade-out processing of gradually decreasing a degree of contribution of the first filter to the characteristic and fade-in processing of gradually increasing a degree of contribution of the second filter to the characteristic, when an instruction is provided for changing the characteristic formed by the set of filters,
   wherein the processor selects a partial filter used for characteristic formation before the instruction as the first filter, sets a parameter to at least one backup partial filter among the plurality of partial filters, the parameter corresponding to the characteristic indicated by the instruction, and selects the at least one backup partial filter as the second filter for the crossfading processing.

2. The filter characteristics changing device according to claim 1, wherein the at least one backup partial filter selected as the second filter is not used for the characteristic formation before the instruction and is associated with the characteristic indicated by the instruction.

3. The filter characteristics changing device according to claim 1, wherein the processor causes a characteristic that is set to the set of filters to be selected from among a plurality of different characteristics, and sets a parameter corresponding to the selected characteristic to the at least one backup partial filter when an instruction for changing to the selected characteristic is provided.

4. The filter characteristics changing device according to claim 1, wherein the plurality of partial filters comprises a plurality of delay recursive filters,
   wherein the set of filters forms a predetermined reverberation characteristic by combining at least two filters selected from among the plurality of delay recursive filters, the plurality of delay recursive filters including at least one backup delay recursive filter, and
   wherein the processor, when an instruction for changing a reverberation characteristic of the set of filters is provided, switches from a delay recursive filter used for reverberation characteristic formation before the instruction among the plurality of delay recursive filters constituting the set of filters to an unused delay recursive filter associated with the reverberation characteristic indicated by the instruction, by using crossfading.

5. The filter characteristics changing device according to claim 1, wherein the set of filters comprises a delay recursive filter, which includes a circulating section and a delay section and is capable of varying a delay time of a signal, and an amplification-related filter which is different from the delay recursive filter and is incapable of varying the delay time of the signal, and
   wherein the processor performs switching by the crossfading processing for the delay recursive filter, and performs, for the amplification-related filter, processing of gradually changing each parameter of the amplification-related filter without using the crossfading processing.

6. The filter characteristics changing device according to claim 1, wherein the processor generates musical performance input information in accordance with a musical performance input operation and, when causing a sound source section to emit a musical sound in accordance with the generated musical performance input information, controls to emit the musical sound after adding a sound effect by the set of filters.

7. An electronic instrument comprising:
   a musical performance input section which generates musical performance input information in accordance with a musical performance operation;
   a sound source section which generates a musical sound in accordance with the musical performance input information generated by the musical performance input section; and
   an effect providing section which includes the filter characteristics changing device according to claim 1.

8. A filter characteristics changing method of a filter characteristics changing device, the method comprising:
   performing, when an instruction is provided for changing a characteristic of a set of filters which includes a plurality of partial filters and which forms a characteristic by combining at least two filters selected from among the plurality of partial filters, fade-out processing of gradually decreasing a degree of contribution of a first filter to the characteristic and fade-in processing of gradually increasing a degree of contribution of a second filter to the characteristic, as crossfading processing for the first filter and the second filter which are selected from among the plurality of partial filters, wherein the device selects a partial filter used for characteristic formation before the instruction as the first filter, sets a parameter to at least one backup partial filter among the plurality of partial filters, the parameter corresponding to the characteristic indicated by the instruction, and selects the at least one backup partial filter as the second filter for the crossfading processing.

9. The filter characteristics changing method according to claim 8, wherein the at least one backup partial filter selected as the second filter is not used for the characteristic formation before the instruction and is associated with the characteristic indicated by the instruction.

10. A non-transitory computer-readable storage medium having stored thereon a program that is executable by a computer to perform functions comprising:

performing, when an instruction is provided for changing a characteristic of a set of filters which includes a plurality of partial filters and which forms a characteristic by combining at least two filters selected from among the plurality of partial filters, fade-out processing of gradually decreasing a degree of contribution of a first filter to the characteristic and fade-in processing of gradually increasing a degree of contribution of a second filter to the characteristic, as crossfading processing for the first filter and the second filter which are selected from among the plurality of partial filters, wherein in the performing the crossfading processing, the computer selects a filter used for characteristic formation before the instruction as the first filter, sets a parameter to at least one backup partial filter among the plurality of partial filters, the parameter corresponding to the characteristic indicated by the instruction, and selects the at least one backup partial filter as the second filter for the crossfading processing.

11. The non-transitory computer-readable storage medium according to claim 10, wherein the at least one backup partial filter selected as the second filter is not used for the characteristic formation before the instruction and is associated with the characteristic indicated by the instruction.

* * * * *